United States Patent [19]

Cavers

[11] Patent Number: 5,489,875
[45] Date of Patent: Feb. 6, 1996

[54] ADAPTIVE FEEDFORWARD LINEARIZER FOR RF POWER AMPLIFIERS

[75] Inventor: James K. Cavers, Richmond, Canada

[73] Assignee: Simon Fraser University, Burnaby, Canada

[21] Appl. No.: 309,478

[22] Filed: Sep. 21, 1994

[51] Int. Cl.⁶ ........................................... H03F 1/32
[52] U.S. Cl. ............................... 330/151; 330/149
[58] Field of Search ........................... 330/149, 151

[56] References Cited

U.S. PATENT DOCUMENTS

| | | | |
|---|---|---|---|
| 4,379,994 | 4/1983 | Bauman | 330/149 |
| 4,380,738 | 4/1983 | Wagner | 330/15 |
| 4,389,618 | 6/1983 | Bauman | 330/149 |
| 4,394,624 | 7/1983 | Bauman | 330/151 |
| 4,412,185 | 10/1983 | Gerard | 330/149 |
| 4,517,521 | 5/1985 | Preschutti et al. | 330/2 |
| 4,560,945 | 12/1985 | Olver | 330/149 |
| 4,595,882 | 6/1986 | Silagi et al. | 330/151 |
| 4,629,996 | 12/1986 | Watanabe et al. | 330/151 |
| 4,885,551 | 12/1989 | Myer | 330/151 X |
| 4,926,134 | 5/1990 | Olver | 330/2 |
| 4,943,783 | 7/1990 | Nojima | 330/149 |
| 5,023,565 | 6/1991 | Lieu | 330/151 |
| 5,043,673 | 8/1991 | Suematsu et al. | 330/149 |
| 5,049,832 | 9/1991 | Cavers | 330/149 |
| 5,051,704 | 9/1991 | Chapman et al. | 330/52 |
| 5,077,532 | 12/1991 | Obermann et al. | 330/151 |
| 5,117,197 | 5/1992 | Hsu et al. | 330/149 |
| 5,130,663 | 7/1992 | Tattersall, Jr. | 330/52 |
| 5,148,117 | 9/1992 | Talwar | 330/151 |
| 5,155,448 | 10/1992 | Powell | 330/149 |
| 5,157,345 | 10/1992 | Kenington et al. | 330/149 |
| 5,157,346 | 10/1992 | Powell et al. | 330/151 |
| 5,166,634 | 11/1992 | Narahashi et al. | 330/151 |
| 5,327,096 | 7/1994 | Sakamoto et al. | 330/151 |

FOREIGN PATENT DOCUMENTS 2167256 5/1986 United Kingdom .................. 330/151

OTHER PUBLICATIONS

"A Microwave Feed–Forward Experiment", H. Seidel, *Bell System Tech J*, vol. 50, No. 9, pp. 2879–2918, Nov. 1971.
"Feedforward— an alternative approach to amplifier linerization", T. J. Bennett and R. F. Clements, *The Radio and Electronic Engineer*, vol. 44, No. 5, pp. 257–262, May 1974.

Primary Examiner—James B. Mullins
Attorney, Agent, or Firm—Oyen Wiggs Green & Mutala

[57] ABSTRACT

A feed forward amplifier circuit for amplifying an input signal to produce an amplified replica thereof. A first splitter splits the input signal into first and second signal cancellation branches. The first signal cancellation branch contains an amplifier and a first "delay, gain and phase adjuster" (DGPA) connected in series between a first output of the first splitter and the amplifier; and, a second splitter connected in series with the amplifier's output for splitting the amplified output signal into first and second distortion cancellation branches. The second signal cancellation branch contains a first delay line connected in series between a second output of the first splitter and a first input of a first combiner. The second splitter has a first output coupled to a second input of the first combiner. The first distortion cancellation branch contains a second delay line connected in series between a second output of the second splitter and a first input of a second combiner. The second distortion cancellation branch contains a third splitter connected in series between the first combiner and a second DGPA, and an auxiliary amplifier connected in series between the second DGPA and a second input of the second combiner. A first controller is connected between an output of the third splitter and the first DGPA to adapt the first DGPA to changes in signals at the third splitter's output and to changes in signals output by the first DGPA. A second controller is connected between an output of a fourth splitter and the second DGPA to adapt the second DGPA to changes in signals at the fourth splitter's output and to changes in signals output by the second DGPA. The fourth splitter is connected to receive the output of the second combiner and provides the amplified replica at its output.

15 Claims, 17 Drawing Sheets

ADAPTIVE FEEDFORWARD LINEARIZER FOR RF POWER AMPLIFIERS

FIELD OF THE INVENTION

This application pertains to linearization of radio frequency (RF) amplifiers to reduce the effects of intermodulation (IM) distortion. A wide band analog feedforward linearizer having signal and distortion cancellation circuits acts directly on RF signals to automatically adjust time delay and amplitude/phase shift coefficients, rapidly adapting the linearizer to changing operating conditions to yield improved IM suppression.

BACKGROUND OF THE INVENTION

All RF amplifiers are nonlinear to some degree, and consequently generate intermodulation (IM) components if the input signal fluctuates in amplitude. In most applications of interest, there are strict limits on the level and frequency distribution of IM power. Examples include mobile and satellite links carrying either single channels with non-constant envelope or multiple channels in any modulation format. The latter is common in base station transmitters. Another example is a cable television (CATV) system, with either coax or fibre trunks.

One solution is to use an inefficient Class A amplifier, and back it off to an even more inefficient operating region where it is reasonably linear. The result is an expensive amplifier with high power consumption and high heat dissipation. An alternative is to employ a linearizer, that is, a device that largely corrects the nonlinear characteristic of less expensive and more efficient Class AB or Class B amplifiers. Linearization of Class C amplifiers is also possible, but is not particularly useful.

The present inventor's U.S. Pat. No. 5,049,832 presents a digital signal processor (DSP) based solution that provides precision signal manipulation, so that the combination of the amplifier and a predistorter is highly linear. A potential drawback of that approach is the computational limit of DSP integrated circuit chips, which, for currently available technology, effectively restricts its applications to a single mobile channel.

The alternative presented here is a feedforward linearizer. It works directly with RF signals in and out, and uses analog technology to manipulate them. Analog technology has its limitations, but narrow bandwidth is not one of them. The feedforward linearizer has the potential to linearize a base station amplifier over the entire 20 Mhz mobile band, an operating range inaccessible to the aforementioned prior art, thereby facilitating accommodation of multiple carriers in a single amplifier.

In simplified terms, a feedforward linearizer cascades a signal cancellation circuit and a distortion cancellation circuit. The signal cancellation circuit has two branches, one of which contains the power amplifier whose output is to be linearized. In particular, the amplifier's output consists of an amplified version of an input signal, plus IM distortion. The other branch of the signal cancellation circuit contains circuitry characterized by a coefficient α (amplitude and phase) that can be adjusted to match the amplitude and phase shift of the amplifier, and a delay, also chosen to match the amplifier. If the match is perfect, the error signal obtained by subtracting the output of the two branches of the signal cancellation circuit equals the IM distortion. In the distortion cancellation circuit, an appropriately amplified and phase shifted version (coefficient β) of the distortion is subtracted from the amplifier output, ideally leaving only the linearly amplified replica at the feedforward output.

The above-described feedforward configuration has been known and studied for over 30 years, but methods for automatic adjustment of the coefficients α and β have only recently been proposed. Those coefficients, and other component tolerances, such as the time delay match in the upper and lower branches of the signal cancellation circuit, are critical to deep suppression of IM power, since the feedforward method is based on subtraction of nearly equal values. Adaptation of the coefficients is essential in an environment where the number of carriers and the operating temperature can both fluctuate, changing the amplifier characteristics with them.

SUMMARY OF THE INVENTION

In accordance with the preferred embodiment, the invention provides a feed forward amplifier circuit for amplifying an input signal to produce an amplified replica thereof. A first splitter splits the input signal into first and second signal cancellation branches. The first signal cancellation branch contains an amplifier and a first "delay, gain and phase adjuster" (DGPA) connected in series between a first output of the first splitter and the amplifier; and, a second splitter connected in series with the amplifier's output for splitting the amplified output signal into first and second distortion cancellation branches. The second signal cancellation branch contains a first delay line connected in series between a second output of the first splitter and a first input of a first combiner. The second splitter has a first output coupled to a second input of the first combiner. The first distortion cancellation branch contains a second delay line connected in series between a second output of the second splitter and a first input of a second combiner. The second distortion cancellation branch contains a third splitter connected in series between the first combiner and a second DGPA, and an auxiliary amplifier connected in series between the second DGPA and a second input of the second combiner. A first controller is connected between an output of the third splitter and the first DGPA to adapt the first DGPA to changes in signals at the third splitter's output and to changes in signals output by the first DGPA. A second controller is connected between an output of a fourth splitter and the second DGPA to adapt the second DGPA to changes in signals at the fourth splitter's output and to changes in signals output by the second DGPA. The fourth splitter is connected to receive the output of the second combiner and provides the amplified replica at its output.

The first and second delay, gain and phase adjusters may each split their respective inputs into main and delayed signal branches, the latter containing a delay line. By means of "complex gain adjusters" (CGAs), splitters and combiners, the DGPAs form a linear combination of the main and delayed signals at their outputs, with the coefficients of the linear combination adjustable by the first and second controllers.

According to one aspect of the invention, the controllers adjust the coefficients of the DGPAs by means of gradient signals produced by bandpass correlators operating on the output of the first combiner and internal signals of the first DGPA, for the first controller, and operating on the output of the second combiner and internal signals of the second DGPA, for the second controller.

According to a second aspect of the invention, the controllers adjust the coefficients of the DGPAs by means of partial gradient signals produced by bandpass correlators operating on selected frequency bands of the output of the first combiner and internal signals of the first DGPA, for the first controller, and operating on selected frequency components of the output of the second combiner and internal signals of the second DGPA, for the second controller. Alternatively, the controllers form partial gradient signals by selecting desired frequency components of the respective inputs and successively reducing them to a common low intermediate frequency prior to delivery to digital signal processors, which calculate said partial gradients.

According to a third aspect of the invention, the controllers adjust the coefficients of the DGPAs by means of estimated partial gradient signals produced from measured values of the output of a power detector connected to the output of the first combiner at several perturbed values of the coefficients of the first DGPA, for the first controller, and from measured values of the output of a power detector connected to the output of the second combiner at several perturbed values of the coefficients of the second DGPA, for the second controller.

According to a fourth aspect of the invention, the controllers adjust the coefficients of the DGPAs by means of estimated partial gradient signals produced from measured values of the output of a power detector connected to the output of the first combiner at several perturbed values of the coefficients of the first DGPA, and for selected frequency components, for the first controller, and from measured values of the output of a power detector connected to the output of the second combiner at several perturbed values of the coefficients of the second DGPA, and for selected frequency components, for the second controller.

DETAILED DESCRIPTION OF THE PREFERRED EMBODIMENT

All amplifiers are non-linear to some degree. If the signal carried by the amplifier has an envelope that fluctuates in magnitude, such as a multicarrier signal or a linear data modulation, then the non-linear operation generates intermodulation (IM) products in the amplifier output. These IM products represent unwanted interference in the operating band of the amplifier. Although it is possible to reduce the power of the IM products relative to the power of the desired signal by reducing the drive level of the amplifier, this expedient also reduces the power efficiency of the amplifier. Increasing the linearity of the amplifier by means of external circuitry can be a more efficient alternative.

Figure 1:
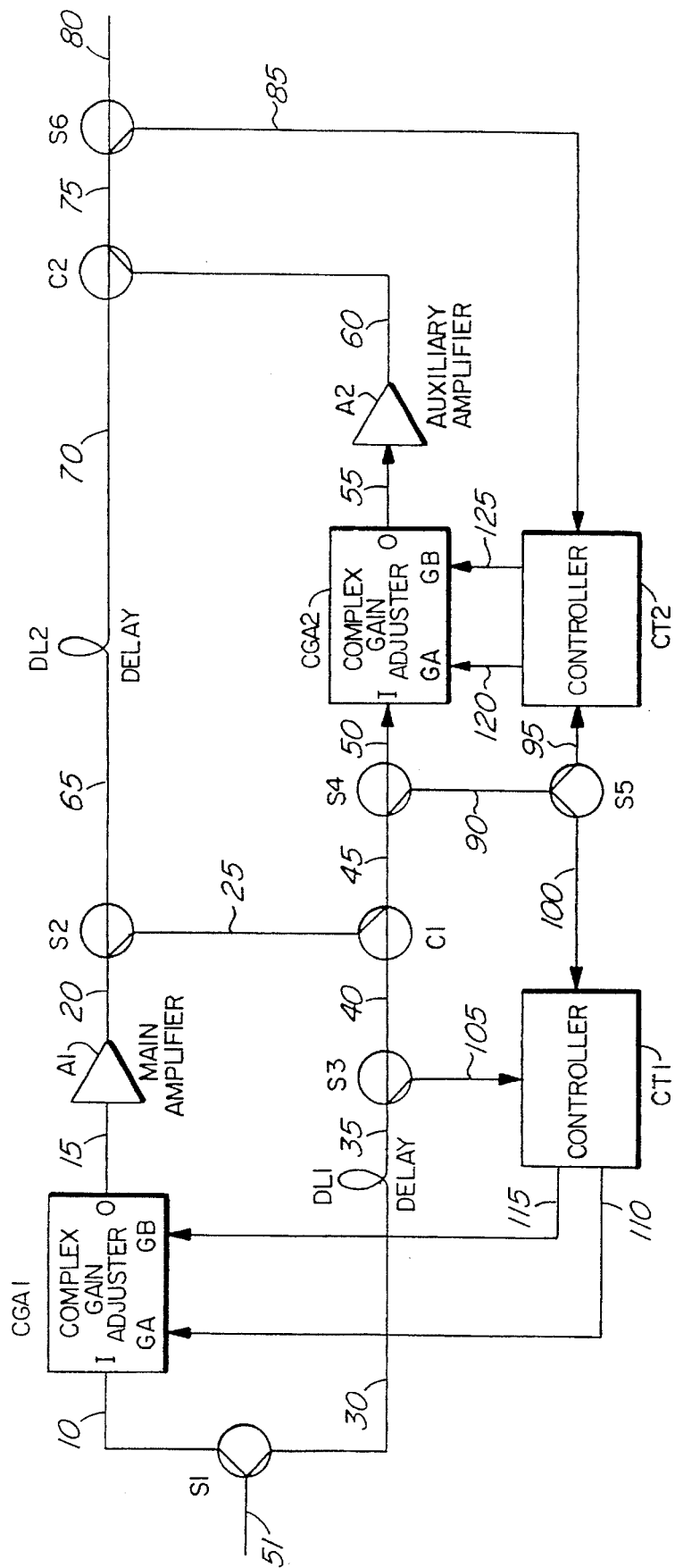
FIG. 1 is a block diagram of a prior art adaptive feed forward amplifier.

Detailed discussions of one such method, feed forward linearization, are provided in "A Microwave Feed-Forward Experiment", by H. Seidel, *Bell System Tech J*, vol 50, no 9, pp 2879–2918, November 1971 and in "Feedforward—an alternative approach to amplifier linearization", by T. J. Bennett and R. F. Clements, *The Radio and Electronic Engineer,* vol 44, no 5, pp 257–262, May 1974. FIG. 1 shows a typical prior art configuration. The incoming signal is split by splitter S1 into two paths comprising the signal cancellation circuit. The first path 10, 15, 20 contains a complex gain adjuster CGA1 and the main amplifier A1, the output 20 of which contains the amplified desired signal and unwanted IM distortion. Splitter S2 directs part of the main amplifier output along line 25 to combiner C1. The second path 30, 35, 40 carries the desired signal, delayed by delay line DL1 to match the delay in the first path, to another input of combiner C1. The complex gain adjuster CGA1 provides means to change the amplitude and phase so that the signal component is cancelled in combiner C1, leaving only the IM distortion at line 45. The distortion cancellation circuit also consists of two branches. In one, the IM distortion on line 45 passes through complex gain adjuster CGA2 and auxiliary amplifier A2 to combiner C2, which receives at its other input 70 the main amplifier output, delayed in delay line DL2 to match the delay of path 25, 45, 50, 55, 60. When complex gain adjuster CGA2 is correctly adjusted, the IM distortion is cancelled in combiner C2, leaving only the amplified input signal at its output 75.

Figure 2A:
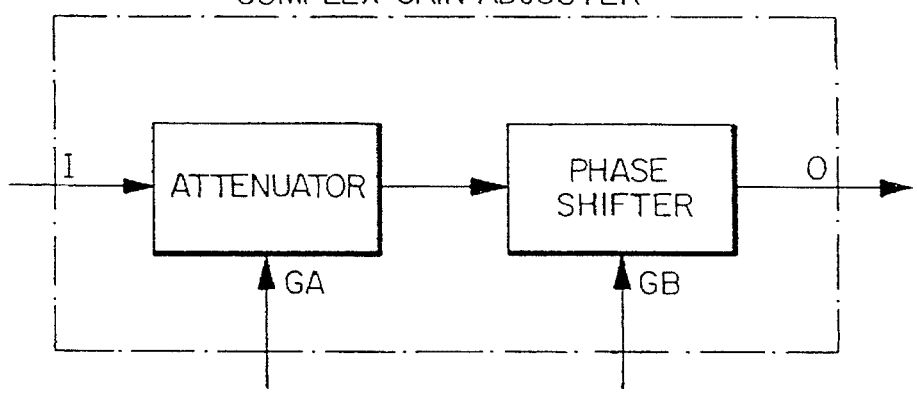
FIGS. 2(a) and 2(b) respectively depict polar and rectangular coordinate implementations of the complex gain adjuster portion of the FIG. 1 amplifier.
Figure 2B:
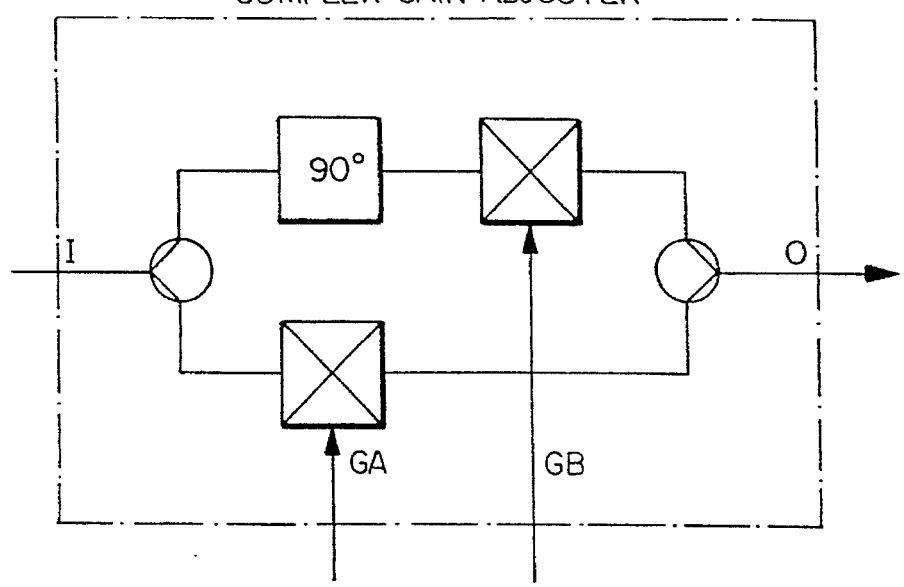

Typical implementations of the complex gain adjuster are shown for polar coordinates in FIG. 2(a) and for rectangular coordinates in FIG. 2(b). The input, output and two components of complex gain are denoted by I, O, GA and GB, respectively.

The complex gain adjuster CGA1 can alternatively be placed in line 30, although doing so precludes cancellation of any distortion introduced by the complex gain adjuster itself.

Because feed forward linearization is based on subtraction of nearly equal quantities, its major parameters must adapt to changes in operating environment, such as signal level, supply voltage and temperature. FIG. 1 shows controllers in a typical prior art configuration.

U.S. Pat. No. 4,885,551 Myer is representative of the "minimum power" principle applied to feed forward adaptation. As exemplified by FIG. 1, in the signal cancellation circuit, controller CT1 operates to minimize the power measured on line 100 using control lines 110 and 115 to complex gain adjuster CGA1. This approach does not make use of line 105. Instead, Myer and others using the minimum power principle (e.g. U.S. Pat. No. 5,023,565 Lieu, and U.S. Pat. No. 5,077,532 Obermann et al), increment the voltages on control lines 110, 115 in the direction that results in a lower power measured on line 100. This method has two drawbacks: it is slow to converge to the minimum, and it is sensitive to measurement noise, especially near the minimum. Since power measurements of random signals are inherently noisy, long dwell times are required at each step in order to reduce the variance of the measurement. This further increases the convergence time.

The minimum power principle can also be applied to adaptation of the distortion cancellation circuit, in which controller CT2 operates to minimize the power measured on line 85 using control lines 120 and 125 to complex gain adjuster CGA2. It does not make use of line 95. However, line 85 carries the amplified signal component as well as the residual IM distortion component to be minimized. The amplified signal masks the IM distortion, since it is several orders of magnitude larger, and the minimization algorithm therefore requires excessively long dwell times at each step to determine the effect of a change in control lines 120, 125. Two methods have been proposed to mitigate the masking effect. In the aforementioned Myer and Lieu patents, a tunable receiver selects frequency bands from line 85 that contain only distortion, and controller CT2 operates to minimize the power in those bands. Obermann et al subtract a gain and phase adjusted replica of the input on line 5 from the signal on line 85, ideally leaving only the IM distortion, and the controller operates to minimize the power in the difference signal.

Figure 3:
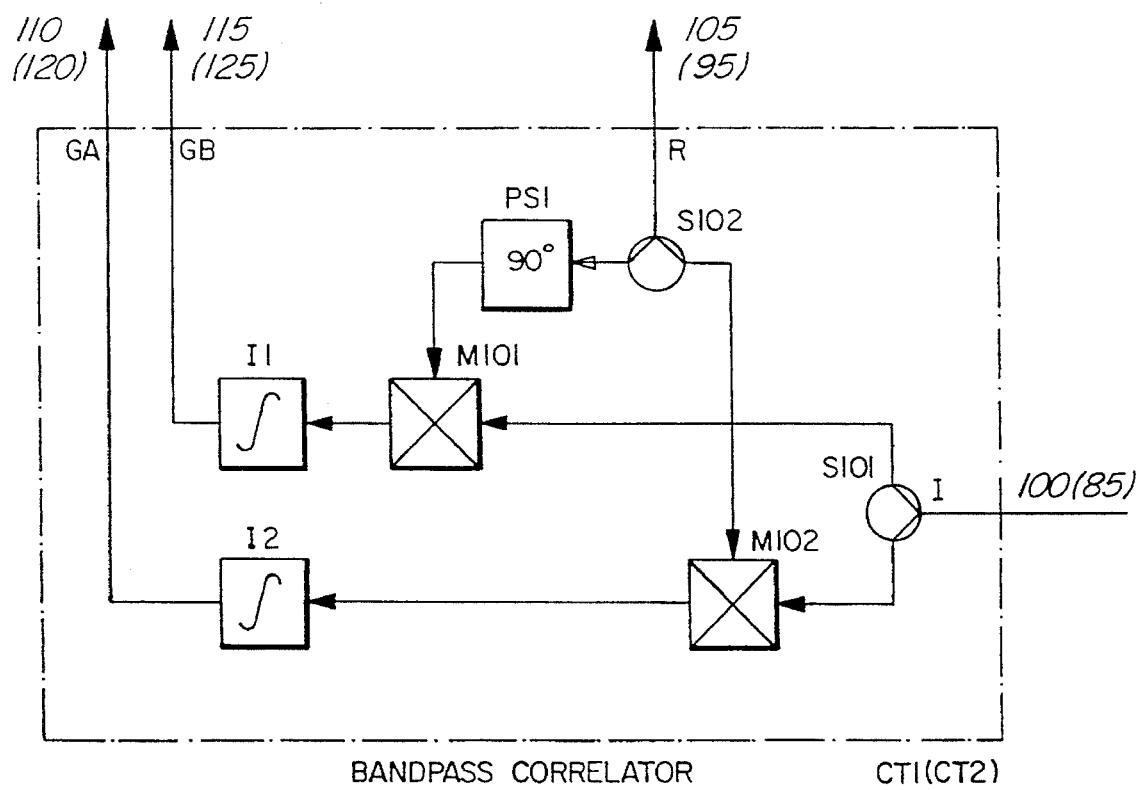
FIG. 3 is a block diagram of the components comprising the bandpass correlator implementation of the controller portions of the FIG. 1 amplifier.

The "gradient" method is an alternative to the minimum power principle for adaptation. U.S. Pat. No. 4,389,618 Bauman is representative of this method. FIG. 3 shows that the signal cancellation controller CT1 is a bandpass correlator. The signal for which the power is to be minimized at input I and a reference signal at input R are split in splitters S101, S102, respectively, and one of them is phase shifted by 90 degrees in phase shifter PS1. Two bandpass mixers M101, M102 produce outputs for which the mean value indicates the direction and size of increments to the complex gain components. Integrators I1, I2 remove high frequency noise and sum the increments to produce the complex gain components at outputs GA and GB. The controller therefore operates to bring the mean value of the gradient to zero. Numeric designations on the input and output lines indicate where the bandpass controller is connected in the signal cancellation circuit. Other embodiments of the gradient method (e.g. U.S. Pat. Nos. 4,560,945 Olver; 5,051,704 Chapman et al; 5,148,117 Talwar; and, 5,157,345 Kenington et al) adapt the control voltages to complex gain adjuster CGA1 similarly. The gradient method is faster than previously proposed minimum power methods and does not require deliberate misadjustments in order to determine the direction of change. However, it is sensitive to DC offset at the output of the mixers that create the gradient signal.

The gradient method can also be applied to adaptation of the FIG. 1 distortion cancellation circuit, as indicated in FIG. 3 by the numeric designations in parentheses. Specifically, controller CT2 operates to bring the mean value of the correlation between the signal on line 85 and the signal on line 95 to zero using control lines 120 and 125 to complex gain adjuster CGA2. However, the masking effect of the amplified input signal also affects the gradient method, resulting in very long convergence times and sensitivity to DC offset in the mixers that create the gradient signal. In the Bauman and Kenington et al patents, the masking effect is mitigated by subtracting a gain and phase adjusted replica of the input on line 5 from line 85, and using the difference in the correlation.

The delay difference between the two branches of the signal cancellation circuit and the delay difference between the two branches of the distortion cancellation circuit limit the degree of cancellation of the feed forward linearizer, particularly near the edges of the operating bandwidth. Prior art linearizers have included fixed compensating delays. However, the delays in the main amplifier and in the auxiliary amplifier may be unknown or may vary with temperature, resulting in delay mismatch and a consequent impaired suppression of IM products. The prior art does not disclose a means for automatic adjustment of compensating delays in the face of unknown or varying delays in other parts of the circuit.

According to one aspect of the present invention, the delay, gain and phase differences are automatically adjusted according to a gradient principle. This differs from previous inventions, which adapt only the gain and phase. Also unlike the prior art, the gradient is approximated as a sum of partial gradients taken over limited bandwidths. In the case of the distortion cancellation circuit, this allows calculation of the gradient over selected frequency bands that do not contain the amplified input signal, in order to reduce the masking effect. The present invention has a further advantage, in that the use of limited bandwidth for each partial gradient allows use of digital signal processing technology to perform the calculation, thereby eliminating the DC offset that could otherwise cause convergence to an incorrect value.

According to another aspect of the invention, the differences are automatically adjusted to minimize the power at the output of the corresponding cancellation circuit. Unlike the prior art, the present invention at each adjustment step makes a set of measurements corresponding to perturbed values of the parameters describing delay, gain and phase and, from these measurements, forms an estimate of the gradient of the power surface. It then adjusts all the parameters describing delay, gain and phase in a direction opposite to the gradient, thereby effecting the greatest decrease in the power to be minimized. In the case of the distortion cancellation circuit, the power to be minimized is the sum of powers measured in selected frequency bands that do not contain the amplified input signal, in order to reduce the masking effect.

Figure 4:
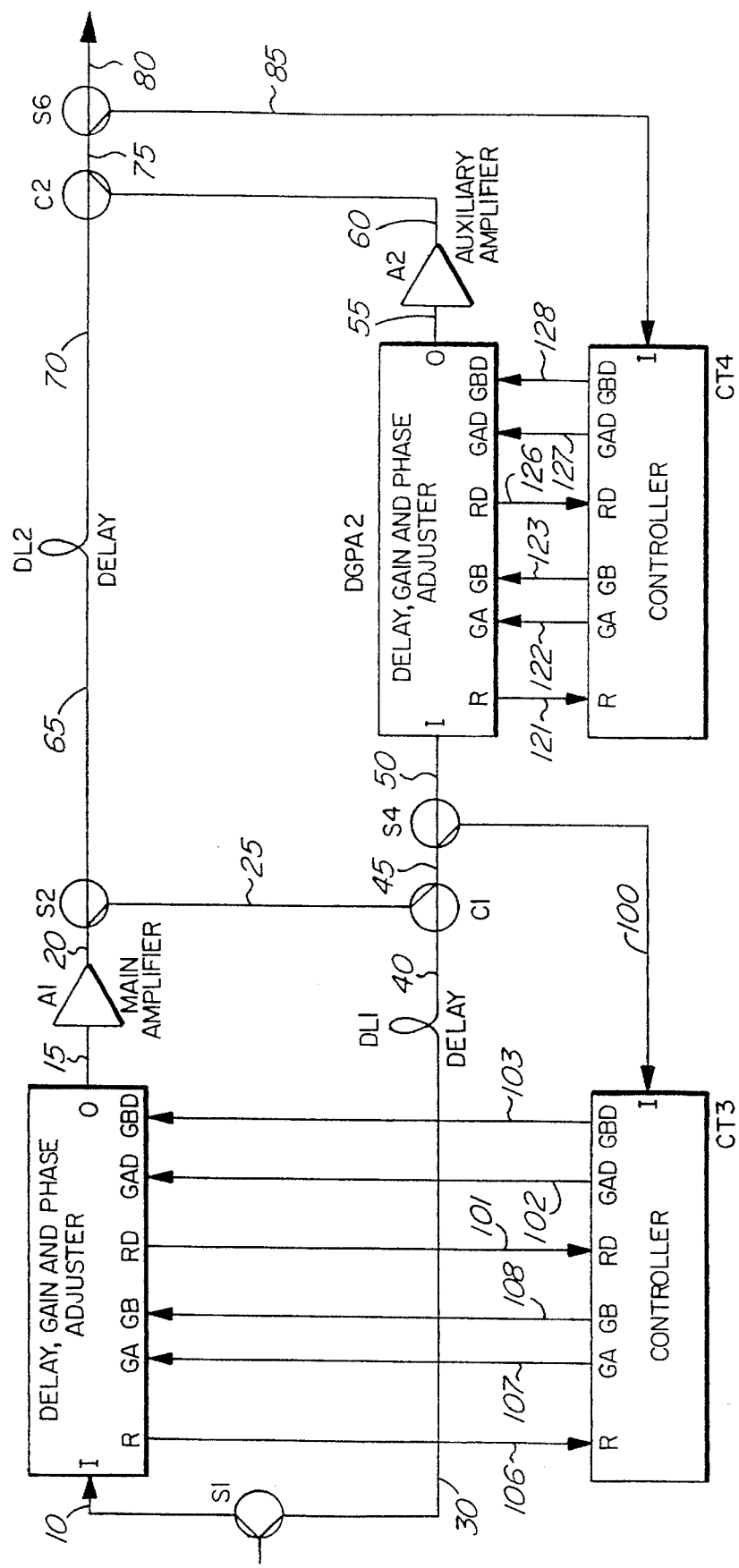
FIG. 4 is a block diagram of an adaptive feedforward linearizer constructed in accordance with the present invention, including the delay, gain and phase adjusting circuit.

FIG. 4 depicts a feed forward amplifier illustrative of the present invention. The input signal on line 5 enters the signal cancellation circuit, where splitter S1 produces two branches. The upper branch consists of the delay, gain and phase adjusting circuit DGPA1 (described below) between lines 10 and 15, the main amplifier A1, and line 25 to combiner C1. The lower branch consists of delay line DL1 and line 40 to combiner C1. The delay in delay line DL1 is selected to be approximately equal to the maximum delay expected in the main amplifier. When adjusted properly, the desired signal is cancelled on line 45, leaving only the distortion and noise generated in the upper branch. The distortion cancellation circuit also has two branches. The upper branch consists of delay line DL2 and line 70 to combiner C2. The lower branch consists of splitter S4, complex gain adjuster DGPA2, auxiliary amplifier A2 and line 60 to combiner C2. When adjusted properly, the distortion is cancelled on line 75, leaving only the desired signal. Controllers CT3 and CT4 operate to adapt the delay, gain and phase in the signal cancellation and the distortion cancellation circuits, respectively.

FIG. 5 (a) shows the preferred embodiment of the delay, gain and phase adjustment circuits DGPA1, DGPA2 shown in FIG. 4. Line numbers and block numbers shown without parentheses are associated with connections in the signal cancellation circuit, whereas line numbers and block numbers shown in parentheses are associated with connections in the distortion cancellation circuit. This convention is followed consistently below. The signal is split in splitter S7 into a main branch consisting of splitter S8 and complex gain adjuster CGA3, and a delayed branch consisting of delay line DL3 and splitter S9. The branches are recombined in combiner C3. The delay in delay line DL3 is selected to be approximately equal to the difference between the maximum and minimum expected delays in the main amplifier over the range of operating conditions. Appropriate settings of complex gain adjusters CGA4 and CGA3 allow line 15 to carry an interpolation of the delayed signal on line 135 and the undelayed signal on line 150. Such interpolations can approximate the input signal with a delay ranging from zero to the delay of delay line DL3. Approximations of delays outside this range are also possible, but with decreasing accuracy.

Figure 5A:
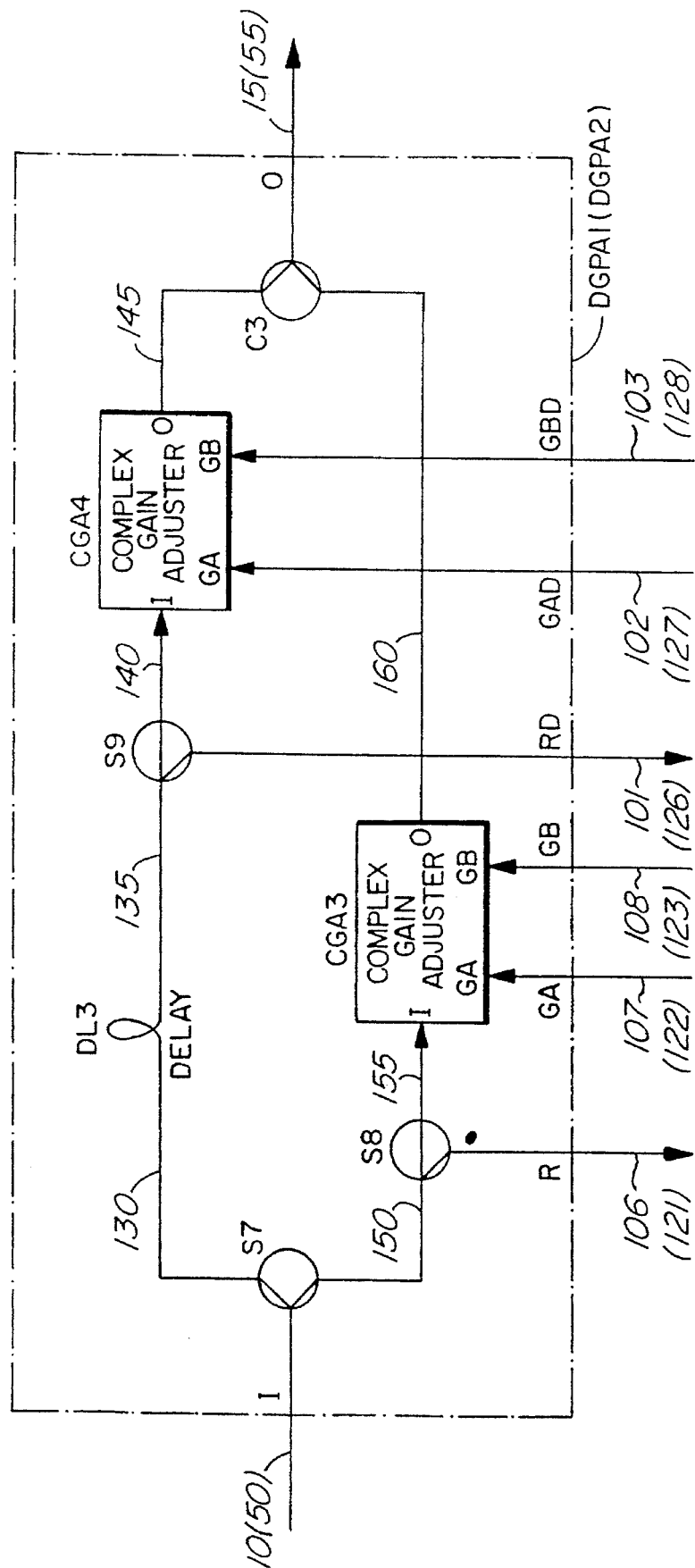
FIGS. 5 (a) and 5 (b) respectively depict two alternative embodiments of a delay, gain and phase adjusting circuit for adaptive feedforward linearizers constructed in accordance with the invention.
Figure 5B:
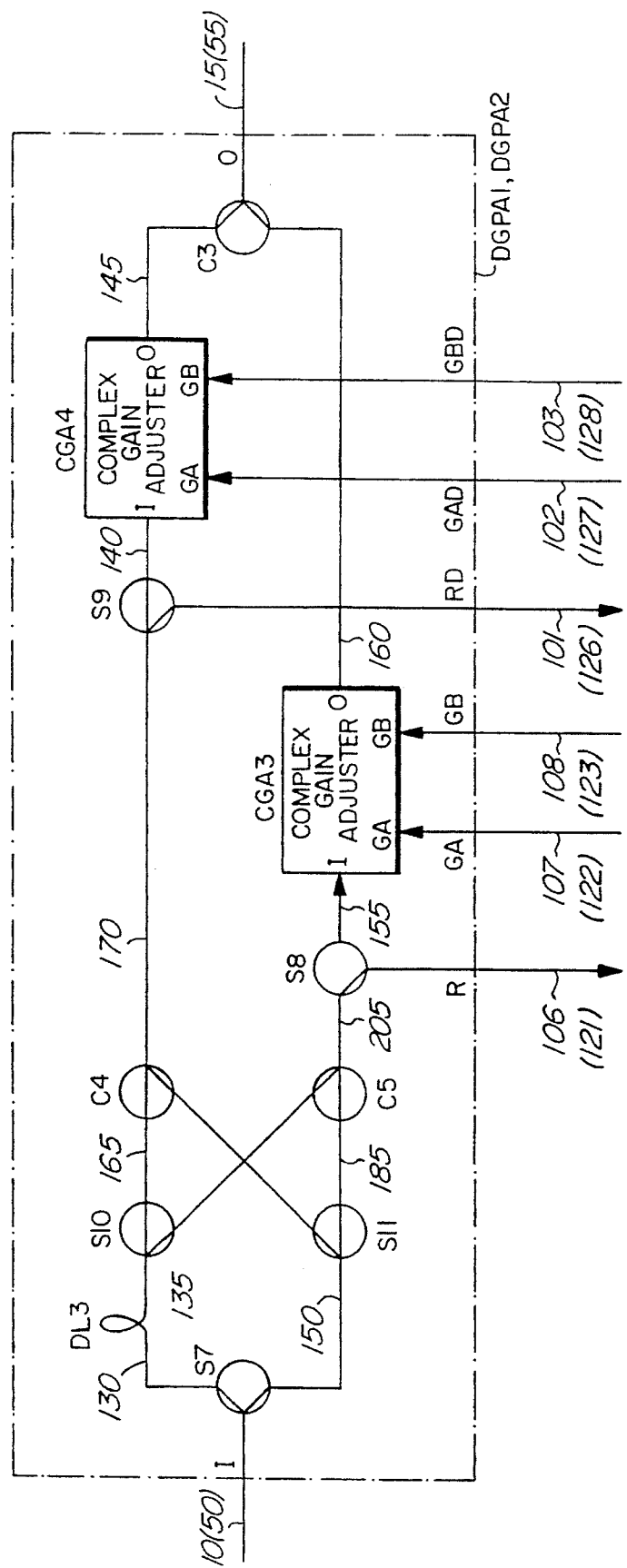

FIG. 5(b) shows an alternative embodiment of delay, gain and phase adjustment circuits DGPA1, DGPA2. This embodiment forms on lines 170 and 205 the sum and the difference of the delayed and undelayed signals, respectively; combiner C5 being arranged to subtract its inputs 185 and 200. The circuit applies the complex gain adjustments to the sum and the difference before recombination. It has the advantage of reducing the degree of interaction between the two branches, so that complex gain adjuster CGA4 can be adjusted substantially independently of complex gain adjuster CGA3. Other linear combinations of the delayed and undelayed signals, and of additional signals at intermediate values of delay, are contemplated as falling within the scope of the invention.

Although delay, gain and phase comprise three parameters, there are four control lines to the delay, gain and phase adjuster circuit (i.e. lines 102, 103, 107, 108 for delay, gain and phase adjuster DGPA1; and, lines 127, 128, 122, 123 for delay, gain and phase adjuster DGPA2). This allows an additional degree of freedom in compensating frequency dependent effects in the signal cancellation circuit, and the adaptation methods described below take full advantage of this degree of freedom.

The delay, gain and phase adjuster circuit can alternatively be placed in the lower branch of the signal cancellation circuit, on line 30, although doing so allows any distortions introduced in the delay, gain and phase adjuster circuit to appear at the final output 75 without being cancelled themselves.

Figure 6:
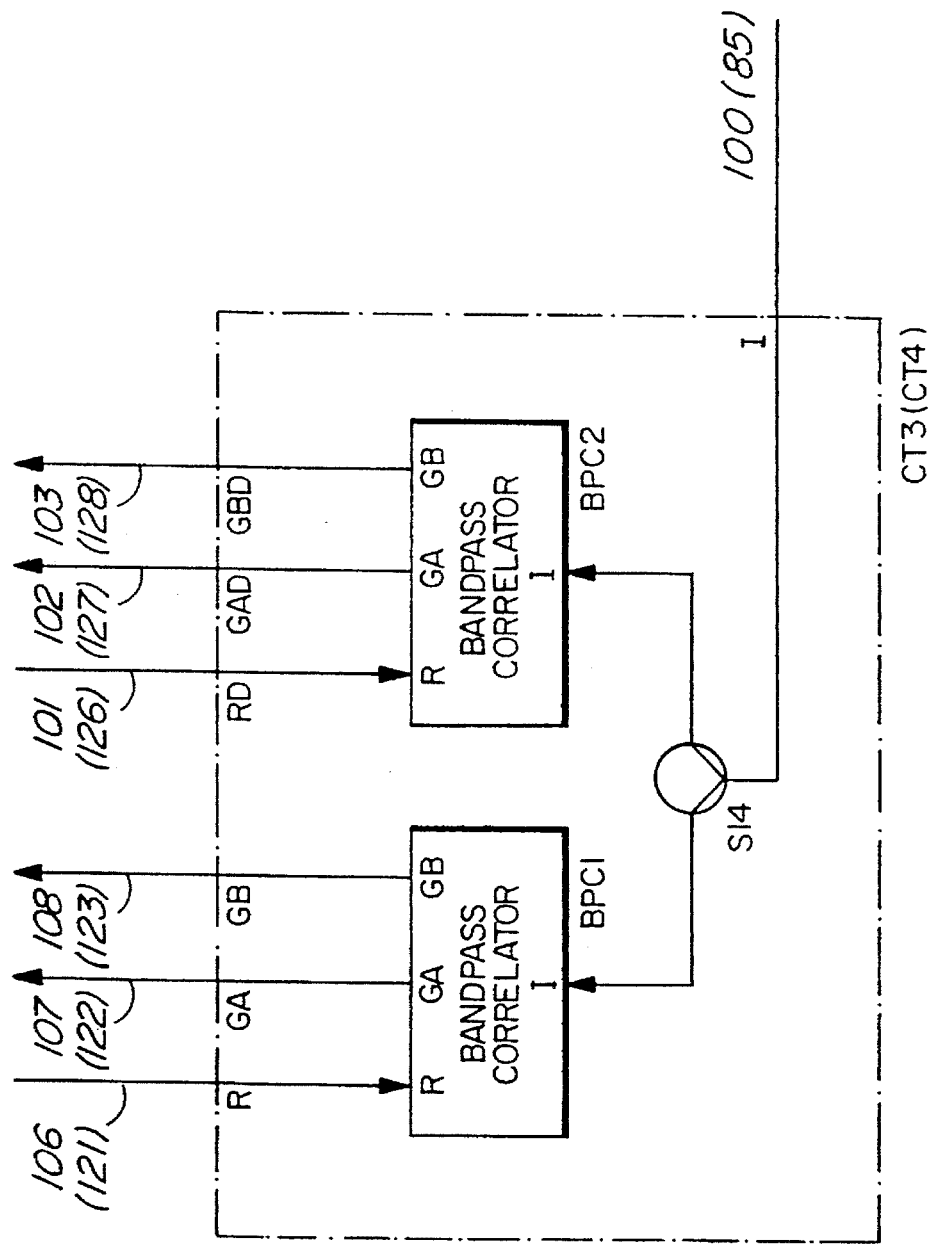
FIG. 6 is a block diagram of components comprising the controller portions of the FIG. 4 amplifier, which embody the gradient principle to adapt the delay, gain and phase adjusting circuit.

In a second aspect of the invention, the delay, gain and phase adjuster circuit is made adaptive by the gradient principle. FIG. 6 shows a detailed view of controller CT3 (or CT4) in the signal cancellation circuit of FIG. 4. Again, line numbers and block numbers shown without parentheses are associated with connections in the signal cancellation circuit, whereas line numbers and block numbers in parentheses indicate connections in the distortion cancellation circuit. By means of dual bandpass correlators, each controlling one of the complex gain adjusters in FIG. 5(a) or in FIG. 5(b), the controller drives to zero the correlation between the undelayed input signal at input R and the distortion signal at input I and the correlation between the delayed input signal at input RD and the distortion signal at input I. The speed of convergence is determined by the gains of the several components in the adaptation loop.

Outputs GA, GB, GAD and GBD from the controller of FIG. 6 are connected to the corresponding inputs of the delay, gain and phase adjusters shown in FIGS. 5(a) and 5(b) through lines 107 (122), 108 (123), 102 (127) and 103 (128). Conversion from rectangular to polar coordinates decreases the convergence time if the complex gain adjusters CGA4, CGA3, CGA6 or CGA5 are implemented in polar coordinates, as shown in FIG. 2(a), but this is not essential.

When the gradient controller of FIG. 6 is employed in the distortion cancellation circuit as controller CT4, the time constants of the convergence must be very large to suppress the masking effect of the signal component on line 85. Moreover, the low signal to noise ratio in the correlation results in a sensitivity to DC offset in the mixer outputs. A solution lies in the partial gradient controller, described immediately below.

Figure 7:
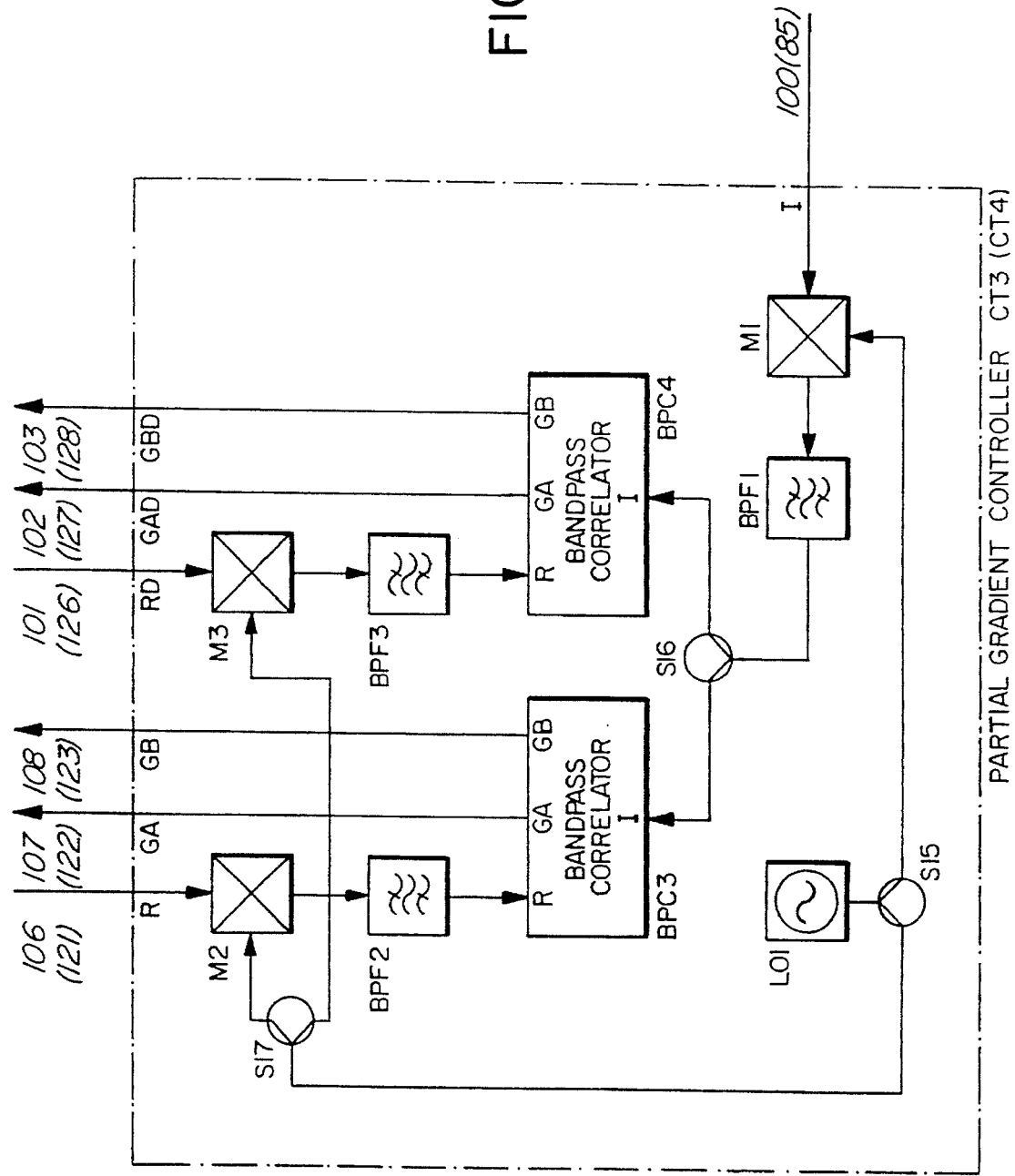
FIG. 7 is a block diagram of components comprising the controller portions of the FIG. 4 amplifier, which embody the partial gradient principle to adapt the delay, gain and phase adjusting circuit.

In a third aspect of the invention, the controllers CT3 and CT4 operate according to a "partial gradient" principle, as illustrated in FIG. 7. A local oscillator LO1 shifts a selected narrow spectral region of the undelayed input signal at input R, the delayed input signal at input RD, and the fed back signal at line I to an intermediate frequency, where the bandpass correlations are performed substantially as in FIG. 6. Shifting and bandwidth limitation are performed in the mixer/bandpass filter combinations M2 and BPF2, M3 and BPF3, and M1 and BPF1. The bandwidth of the bandpass filters is significantly less than the operating bandwidth of the amplifier, so that only a partial gradient is produced. In operation, the output frequency of oscillator LO1 is stepped across the operating band. The sum of the resulting partial correlations is a good approximation to the full gradient calculated by the circuit in FIG. 6, and the integrators contained in bandpass correlators BPC3 and BPC4 inherently perform such a summation.

Figure 8A:
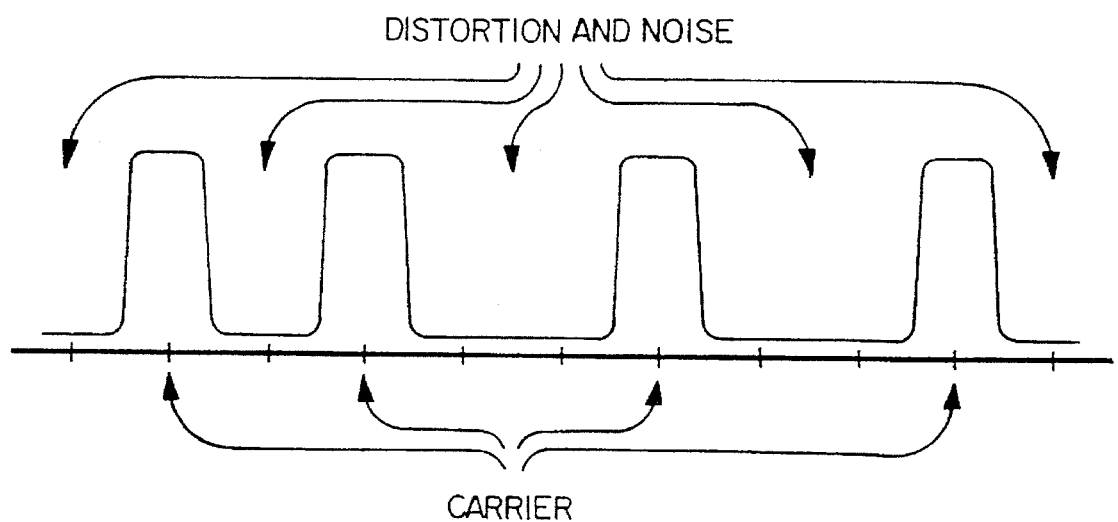
FIGS. 8 (a) and 8 (b) respectively depict carrier and distortion spectra of the FIG. 4 amplifier for multicarrier and for single carrier inputs.
Figure 8B:
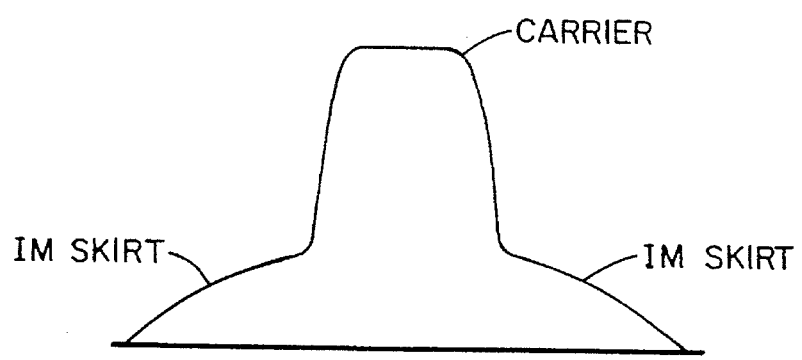

One advantage of the partial gradient principle applied to controller CT4 in the distortion cancellation circuit is that it can reduce the masking effect of the desired signal on line 85. In the case of a multicarrier signal, as shown in FIG. 8(a), the bandwidth of the bandpass filter is selected not to exceed the bandwidth of each carrier, and the output frequency of oscillator LO1 steps in increments of multiples of the minimum carrier spacing, selecting only those carrier locations that contain distortion and noise, with no component of the input signal. The resulting sum of selected partial correlations is only an approximation of the true gradient, but it has much improved signal to noise ratio. In the case of a single carrier, as shown in FIG. 8(b), the "skirts" of the spectrum contain IM distortion, and the partial gradients are calculated only in these skirts, and include no component of the desired signal. Similarly, but with less advantage, controller CT3 in the signal cancellation circuit can apply the partial gradient principle. In this case, the oscillator LO1 selects only those spectral regions that contain the carriers or the desired signal, in order to minimize masking effects of the distortion and noise.

Figure 9:
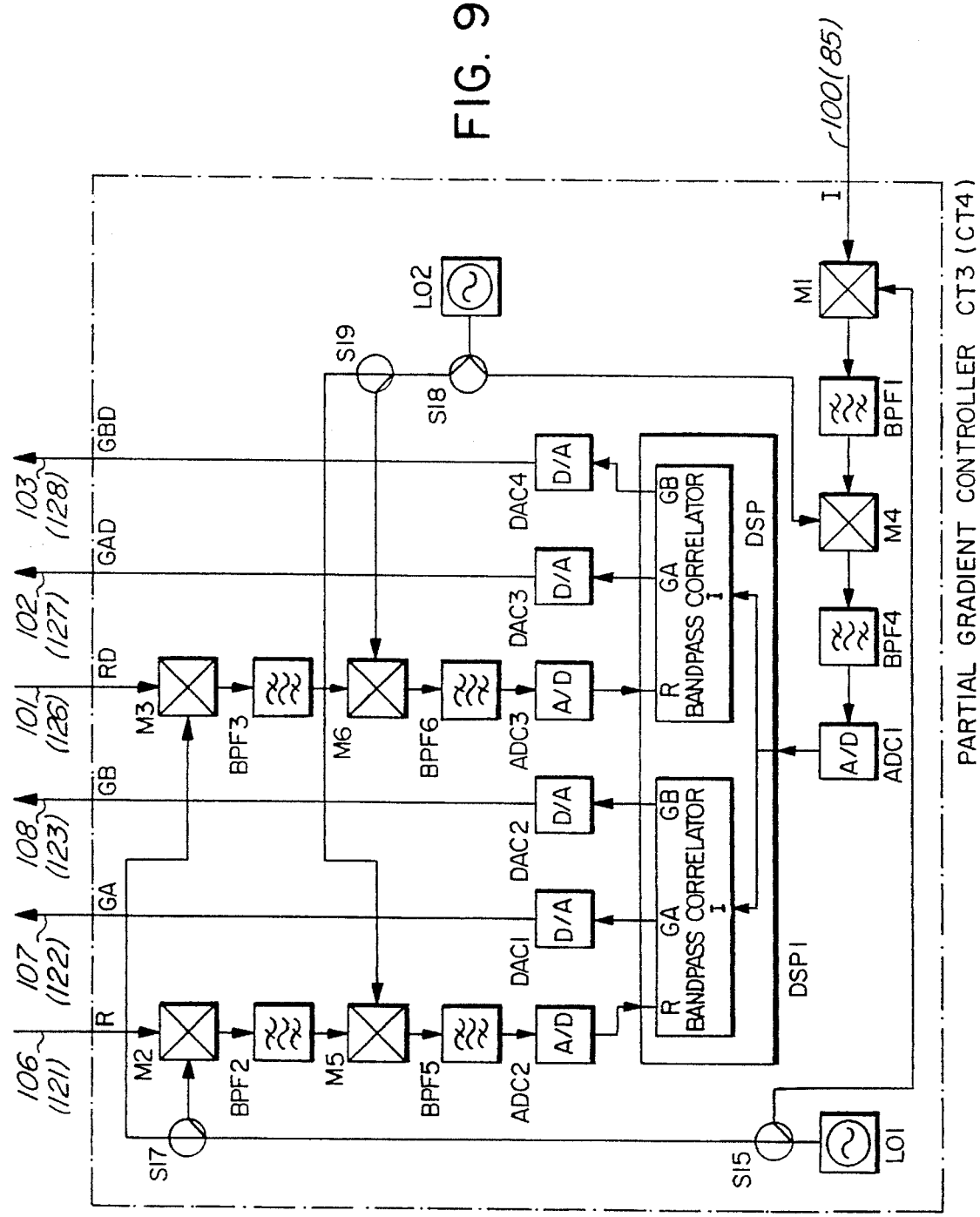
FIG. 9 is a block diagram of components comprising the controller portions of the FIG. 4 amplifier, which employ the partial gradient principle implemented with digital signal processing circuitry to adapt the delay, gain and phase adjusting circuit.

A second advantage of the partial gradient controller is that the narrower bandwidth lends itself to implementation of the correlation operation by means of digital signal processing technology. As will now be demonstrated, the DC offsets inherent in analog mixers can, in consequence, be eliminated. FIG. 9 shows one embodiment. As in FIG. 7, oscillator LO1 and mixer/bandpass filter combinations M2 and BPF2, M3 and BPF3, and M1 and BPF1 shift narrow spectral regions of the undelayed input signal at input R, the delayed input signal at input RD, and the fed back signal at input I all to an intermediate frequency $f_I$. A second stage of down conversion shifts the outputs of bandpass filters to a range suitable for further processing in the digital signal processor DSP1. This second stage is accomplished by oscillator LO2, which produces a carrier at frequency $f_I$-W/2, where W is the bandwidth of the bandpass filters BPF2, BPF3 and BPF1, and by mixer/bandpass filter combinations M5 and BPF5, M6 and BPF6, and M4 and BPF4. The outputs of the bandpass filters are centered at frequency W/2 and have bandwidth less than W. The DC offsets at the outputs of mixers M5, M6 and M4 are thereby eliminated. The bandpass filter outputs are then sampled at a rate at least equal to 2 W per second and converted to digital format in analog to digital converters ADC2, ADC3 and ADC1, from which they enter digital signal processor DSP1. The digital signal processor program operates as a pair of bandpass correlators to create the control signals GA, GB, GAD, and GBD through digital to analog converters DAC1, DAC2, DAC3 and DAC4.

If controllers CT3 or CT4 operating according to the partial gradient principle are employed with the sum and difference form of the delay, gain and phase adjuster circuit illustrated in FIG. 5(b), then the line designations 106 (121), 107(102), 108 (123), 101 (126), 102 (127) and 103 (128) indicate the connections between the controller and the delay, gain and phase adjuster circuit.

Figure 10:
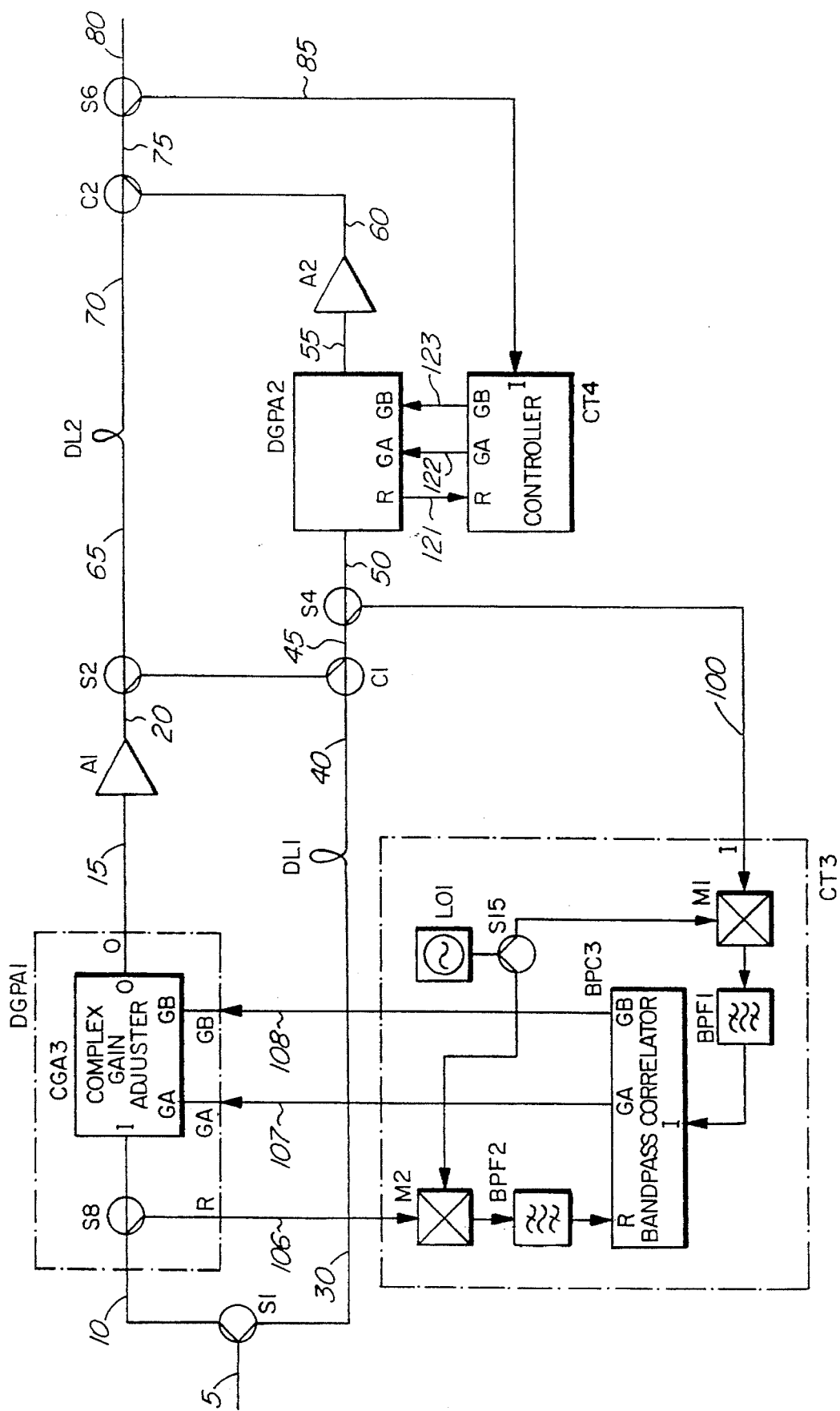
FIG. 10 is a block diagram of an adaptive feedforward amplifier constructed in accordance with the present invention which employs the partial gradient principle to adapt the complex gain adjusting circuit for the case in which delay variations are not significant.

A particular configuration of the partial gradient controller is applicable when delay variations in the main and auxiliary amplifiers are not significant, and it is sufficient to employ a complex gain adjuster instead of a full delay, gain and phase adjuster. FIG. 10 illustrates this use of the partial gradient controller in the signal cancellation circuit, where the oscillator LO1 steps across the operating band, selecting frequency bands that contain the desired signal. Comparison with FIG. 7 demonstrates considerable simplification. When this simplified form of the partial gradient controller is used for controller CT4 of the distortion cancellation circuit, the oscillator selects frequency bands that contain IM products that do not contain the desired signal, in order to reduce the masking effect.

Figure 11:
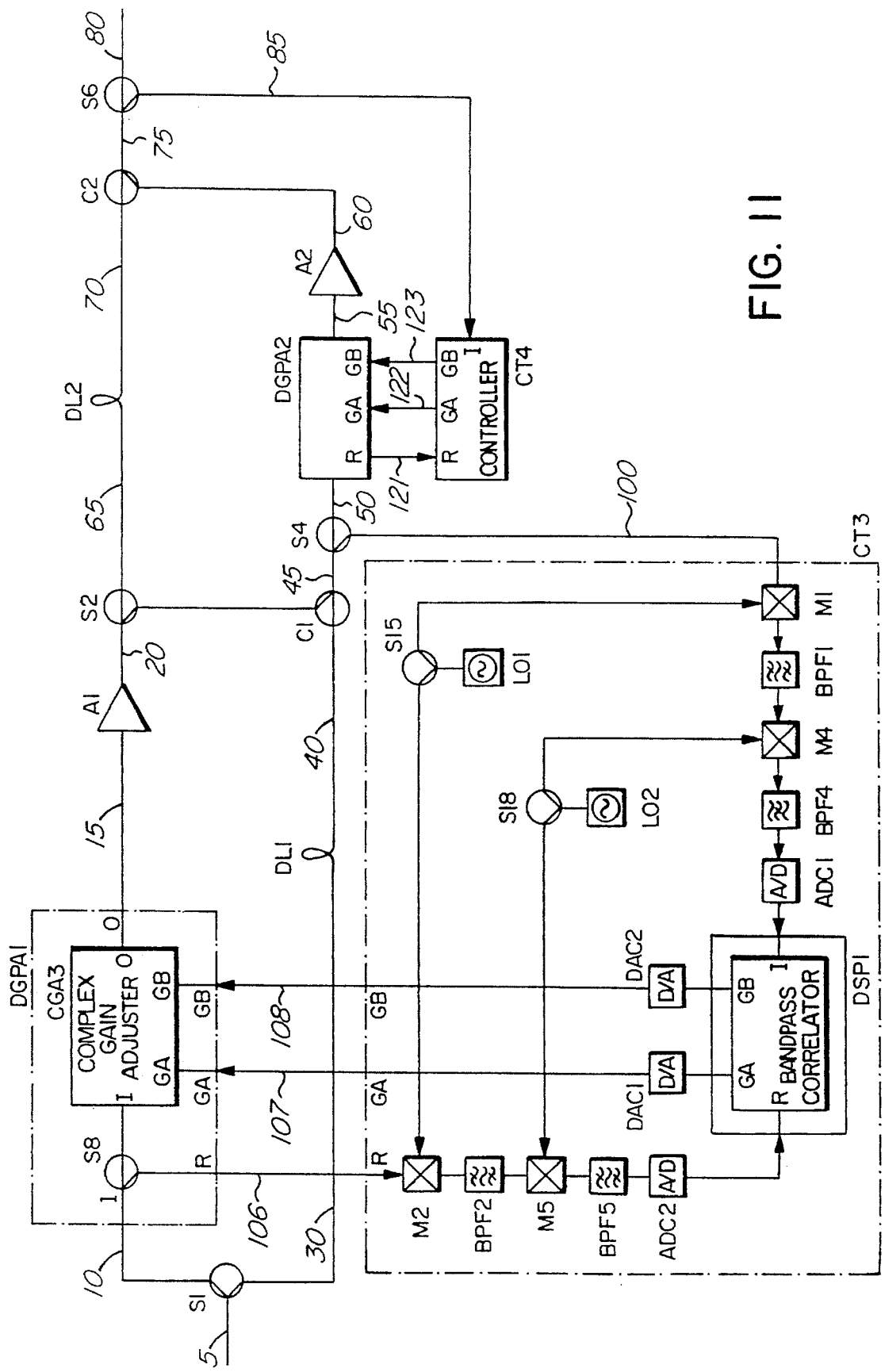
FIG. 11 is a block diagram of an adaptive feedforward amplifier constructed in accordance with the present invention which employs the partial gradient principle implemented with digital signal processing circuitry to adapt the complex gain adjusting circuit for the case in which delay variations are not significant.

The digital signal processing implementation of the partial gradient controller is similarly simplified when delay variations in the main and auxiliary amplifiers are not significant, and it is sufficient to employ a complex gain adjuster instead of a full delay, gain and phase adjuster. FIG. 11 illustrates the configuration; it is considerably simpler than FIG. 9, but it retains the advantage of eliminating DC offset. When this controller is employed in the signal cancellation circuit, as illustrated, the oscillator LO1 selects bands containing the desired signal. Conversely, when it is used for controller CT4 of the distortion cancellation circuit, the oscillator selects bands that contain IM products that do not contain the desired signal.

Figure 12:
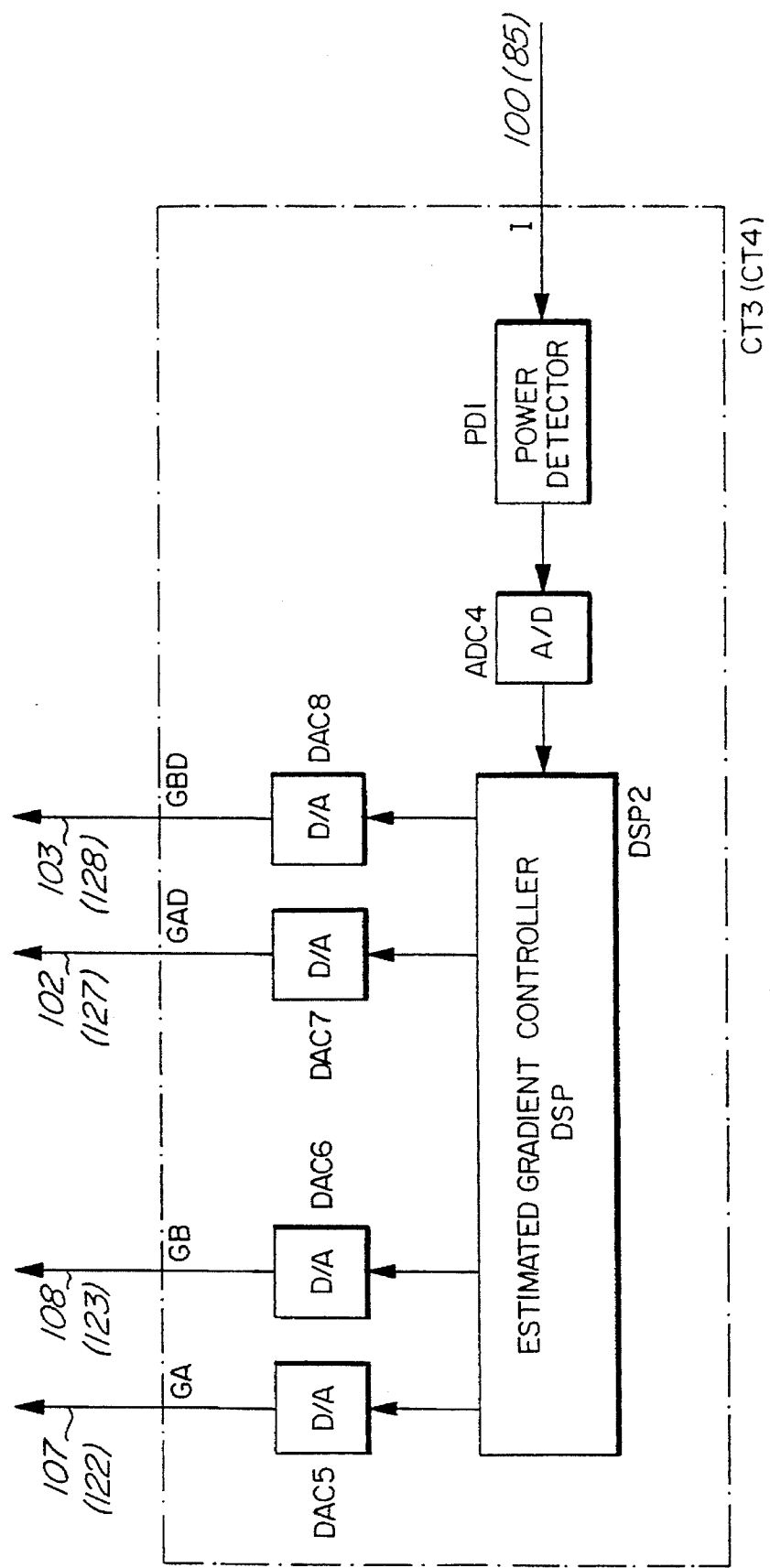
FIG. 12 is a block diagram of components comprising the controller portions of the FIG. 4 amplifier, which employ the estimated gradient technique to adapt the delay, gain and phase adjusting circuit.

In a fourth aspect of the invention, the delay, gain and phase adjuster circuit is made adaptive according to the "minimum power", principle by calculation of an estimated gradient. FIG. 12 shows a detailed view of the estimated gradient controller, corresponding to controllers CT3 and CT4 in FIG. 4. As in the description above, line numbers and block numbers shown without parentheses are associated with connections in the signal cancellation circuit, whereas line numbers and component numbers in parentheses are associated with the distortion cancellation circuit. The inputs R and RD shown in FIG. 4 are not used. The digital signal processor DSP2 adjusts the control voltages on lines 107 (122), 108 (123), 102 (127) and 103 (128), which are connected to the GA, GB, GAD, and GBD inputs of the delay, gain and phase adjuster DGPA1 (DGPA2) in order to minimize the power at input I from line 100 (85).

The controller employs a set of internal variables GASUM, GADIFF, GBSUM and GBDIFF. Immediately before it makes any change to the control lines GA, GB, GAD and GBD, the controller calculates their values from the internal variables as follows:

GA=GASUM+GADIFF

GB=GBSUM+GBDIFF

GAD=GASUM−GADIFF

GBD=GBSUM−GBDIFF

In operation, the controller alternates between making a series of adjustments to the pair of internal variables GASUM and GBSUM and making a series of adjustments to the pair of internal variables GADIFF and GBDIFF. With each adjustment, it updates the values on lines GA, GB, GAD and GBD, as specified above. The effect of each series of adjustments is to reduce the power measured at input I.

Figure 13:
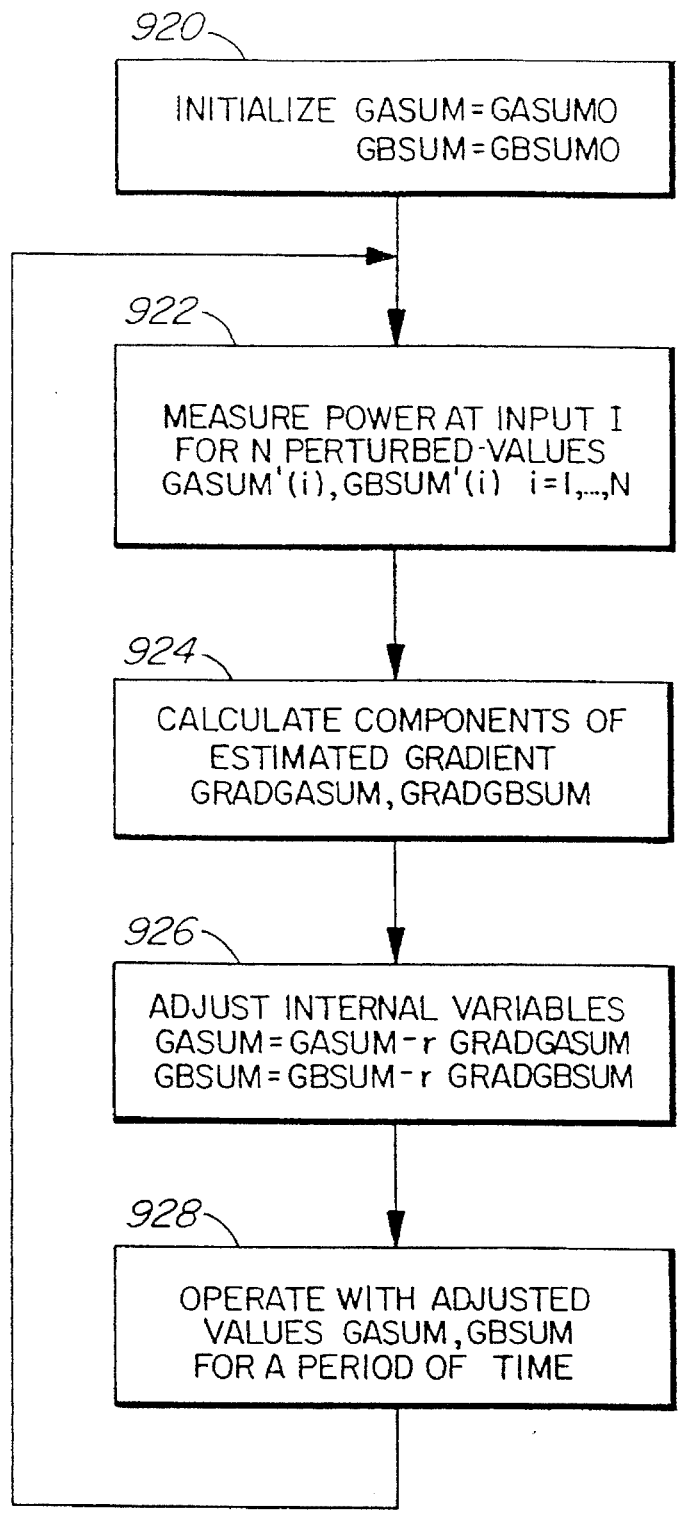
FIG. 13 is a flow chart showing the sequence of steps taken in applying the estimated gradient technique to adaptation of one complex gain in the delay, gain and phase adjusting circuit.

To adapt the internal variables according to the minimum power principle, the controller's series of adjustments proceeds according to an estimated gradient technique, as will now be described. FIG. 13 is a flow chart depicting the basic operation for the pair of variables GASUM and GBSUM. Operation for the variables GADIFF and GBDIFF is similar. When it is first turned on, the controller initializes GASUM and GBSUM, and therefore the lines GA, GB, GAD, and GBD, using stored initial values GASUM0 and GBSUM0. In the simplest case, these initial values are both zero; however, more prior knowledge of the amplifier allows initialization closer to the optimum values. The controller then alternates between adjusting the values GASUM and GBSUM, making the corresponding changes on lines GA, GB, GAD and GBD (blocks 922, 924 and 926), and operating with those new values for a period of time (block 928).

Since the adjustment step requires perturbing the values GASUM and GBSUM, and possibly temporarily increasing the power at input I as a result, the period of time spent operating with the new values can be selected to trade off the speed of adaptation against the increased power.

The adjustment consists of three steps. In the first (922), the controller makes N small perturbations to the values GASUM and GBSUM, making the corresponding changes on lines GA, GB, GAD and GBD, and measures the resulting power at input I for each perturbation. In the second step (924), the controller estimates the gradient of the power with respect to GASUM and GBSUM from these measurements. In the third step (926), the controller adjusts GASUM and GBSUM in the direction opposite to the estimated gradient. The value of the coefficient r in block 926 determines the speed of convergence. Normally, it is positive and less than unity, so the adjustment results in a movement toward the minimizing values of GAMIN and GBMIN.

The perturbation, power measurement and calculation of estimated gradient performed in blocks 922 and 924 will now be described in detail. For any iteration of the loop in FIG. 13, we have a set of N displacements $DA(i)$ and $DB(i)$, for $i=1,\ldots,N$. It is convenient, though not necessary, to use the same displacement values at each iteration. From the displacements we derive the length-3 column vector $v(i)$ as follows $$v(i)=[DA(i), DB(i), 1]^T$$

where T indicates transpose, and we derive the 3×3 matrix R as follows $$R = \sum_{i=1}^{N} v(i) v(i)^T$$

In block 922, for each $i=1,\ldots,N$, the controller creates perturbed values GASUM' and GBSUM' as follows $$GASUM'(i)=GASUM+DA(i)$$

$$GBSUM'(i)=GBSUM+DB(i)$$

then makes the corresponding changes to lines GA, GB, GAD and GBD, and performs the corresponding power measurement $p(i)$. In block 924, the controller first forms the length-3 column vector w as follows:

$$w = \sum_{i=1}^{N} p(i)v(i)$$

To estimate the gradient, the controller multiplies w by the inverse of R to form the length-3 column vector z $$z=R^{-1}w$$

and uses its first two components to form $$GRADGASUM=z_1$$

$$GRADGBSUM=z_2$$

Those skilled in the art will recognize that judicious choice of the set of displacements may reduce the amount of computation in the general method presented here.

The novelty of the controller presented here lies both in its application of the minimum power principle to a feedforward amplifier based on a delay, gain and phase adjusting circuit, and in its use of an estimated gradient technique. In contrast to prior art, the estimated gradient technique makes allowance for the random element in the power measurements, and it does so in two ways. First, at each adjustment, formation of the vector w explicitly averages the measurement error in the N perturbations. Second, the adjustment step itself calculates the new values of GASUM and GBSUM as a linear combination of their previous values and the estimated gradient components GRADGASUM and GRADGBSUM, which implicitly forms an exponentially weighted average of all prior measurements.

Figure 14:
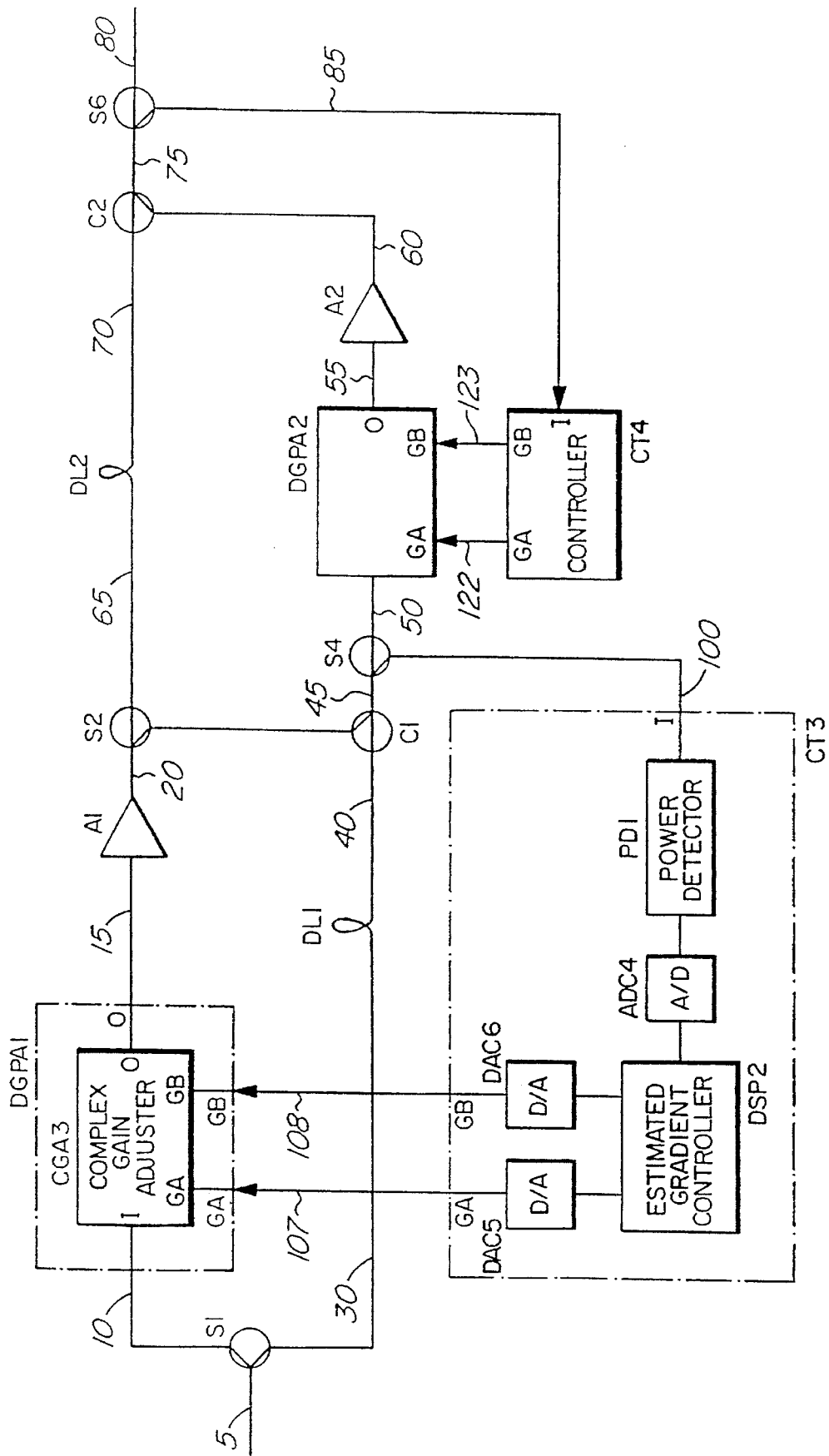
FIG. 14 is a block diagram of an adaptive feedforward amplifier constructed in accordance with the present invention which employs the estimated gradient technique to adapt the complex gain adjusting circuit for the case in which delay variations are not significant.

A particular configuration of the estimated gradient controller is applicable when delay variations in the main and auxiliary amplifiers are not significant, and it is sufficient to employ a complex gain adjuster instead of a full delay, gain and phase adjuster. FIG. 14 illustrates this use of the estimated gradient controller in the signal cancellation circuit. Comparison with FIG. 12 demonstrates that two digital to analog converters have been eliminated. Moreover, the stored program for the estimated gradient algorithm implemented in DSP2 needs to be executed for only one pair of complex gain variables GA and GB. The configuration is similar when this simplified form of the estimated gradient controller is employed in controller CT4 of the distortion cancellation circuit.

In a fifth aspect of the invention, the controllers operate according to a "minimum partial power" principle, as will now be described. It was noted several times above that the signal component can mask the distortion component at the output of the circuit. In a manner analogous to the partial gradient principle, the controller can suppress the masking by calculating the partial power at the input I by summing the powers measured in spectral regions that do not contain the signal component. By perturbing the parameters of the delay, gain and phase adjusters, the controller forms a corresponding estimated partial gradient.

Figure 15:
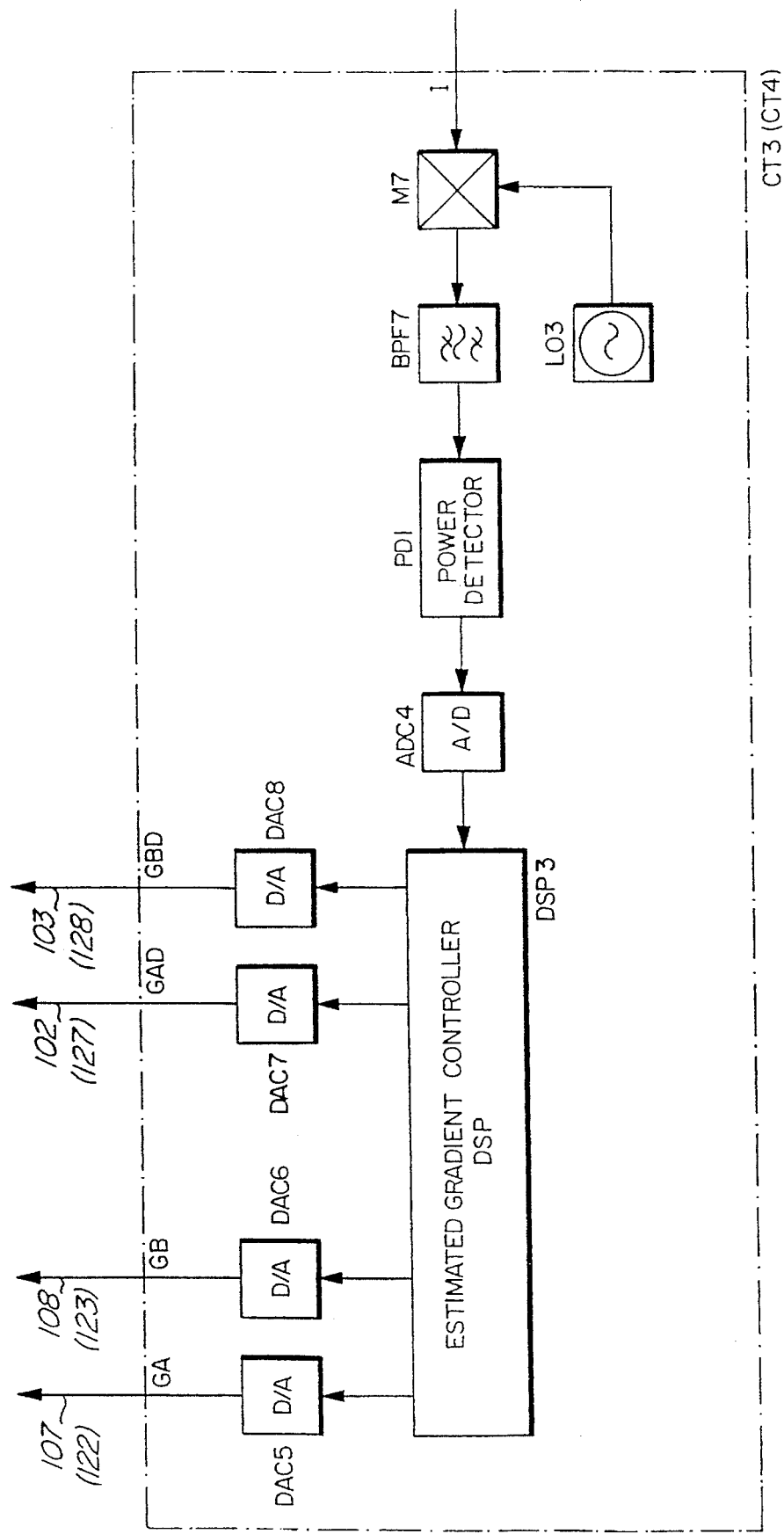
FIG. 15 is a block diagram of components comprising the controller portions of the FIG. 4 amplifier, which employ the estimated partial gradient technique to adapt the delay, gain and phase adjusting circuit.

FIG. 15 shows a block diagram of the estimated partial gradient controller. The output frequency of oscillator LO3 is stepped across the operating band. Spectral regions centered on the oscillator frequency are selected by the bandpass filter, enabling the digital signal processor DSP3 to measure the power in that spectral region by means of the power detector PD1 and analog to digital converter ADC4. In the signal cancellation circuit, the combination of oscillator and bandpass filter selects only those spectral regions containing the desired signal; in the distortion cancellation circuit, the combination of oscillator and bandpass filter selects only those spectral regions that contain distortion and noise, without the desired signal. After each sweep of the operating band, the controller sums the powers measured in the individual spectral regions, and this sum forms the power measurement $p(i)$ used in its estimated gradient algorithm. Thus each of the N perturbations requires a complete sweep of the selected spectral regions.

Figure 16:
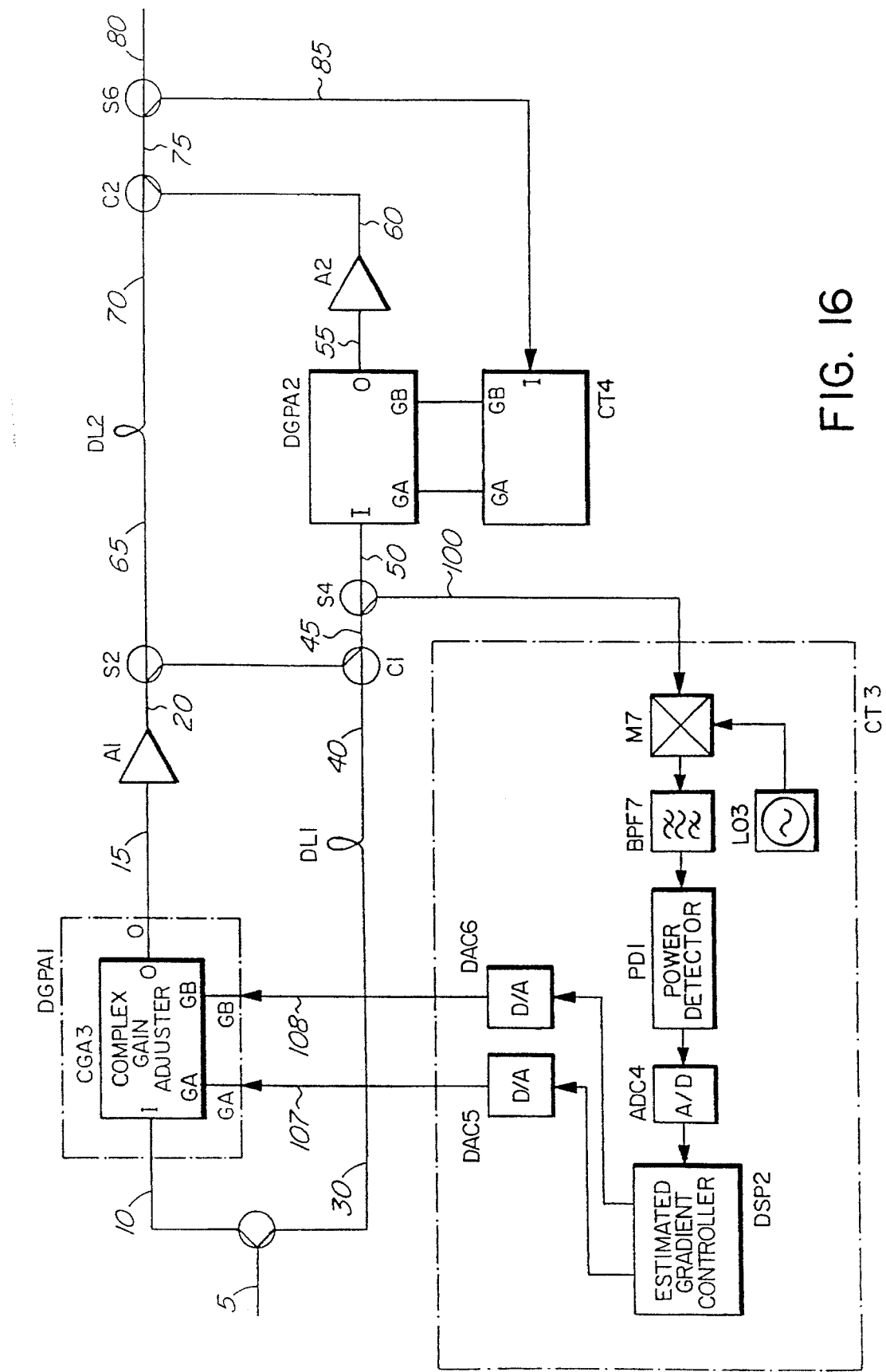
FIG. 16 is a block diagram of an adaptive feedforward amplifier constructed in accordance with the present invention which employs the estimated partial gradient technique implemented with digital signal processing circuitry to adapt the complex gain adjusting circuit for the case in which delay variations are not significant.

The estimated partial gradient controller is simplified when delay variations in the main and auxiliary amplifiers are not significant, and it is sufficient to employ a complex gain adjuster instead of a full delay, gain and phase adjuster, as illustrated in FIG. 16. In comparison with FIG. 15, two digital to analog converters are eliminated and the estimated partial gradient algorithm needs to be executed for only one pair of complex gain variables GA and GB. The oscillator LO3 selects frequency bands that contain the desired signal when the controller is used as CT3 in the signal cancellation circuit, as illustrated. When employed as CT4 in the distortion cancellation circuit, however, the oscillator selects bands containing IM products and not the desired signal, in order to reduce the masking effect.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A feed forward amplifier circuit for amplifying an input signal to produce an amplified replica thereof, said circuit comprising:

a first splitter (S1) for splitting said input signal into first and second signal cancellation branches;

said first signal cancellation branch comprising an amplifier (A1) for producing an amplified output signal (20), first delay, gain and phase adjusting means (DGPA1) connected in series between a first output (10) of said first splitter (S1) and said amplifier (A1), and a second splitter (S2) connected in series with said amplifier output (20) for splitting said amplified output signal (20) into first and second distortion cancellation branches;

said second signal cancellation branch comprising a first delay line (DL1) connected in series between a second output (30) of said first splitter (S1) and a first input (40) of a first combiner (C1);

said second splitter (S2) having a first output (25) coupled to a second input of said first combiner (C1);

said first distortion cancellation branch comprising a second delay line (DL2) connected in series between a second output (65) of said second splitter (S2) and a first input (70) of a second combiner (C2);

said second distortion cancellation branch comprising a third splitter (S4) connected in series between said first combiner (C1) and a second delay, gain and phase adjusting means (DGPA2), an auxiliary amplifier (A2) connected in series between said second delay, gain and phase adjusting means (DGPA2) and a second input (60) of said second combiner (C2);

a first controller (CT3) connected between an output (100) of said third splitter (S4) and said first delay, gain and phase adjuster (DGPA1), said first controller (CT3) for adapting said first delay, gain and phase adjuster (DGPA1) to changes in signals at said output (100) and to changes in signals (R, RD) output by said first delay, gain and phase adjuster (DGPA1);

a second controller (CT4) connected between an output (85) of a fourth splitter (S6) and said second delay, gain and phase adjuster (DGPA2), said second controller (CT4) for adapting said second delay, gain and phase adjuster (DGPA2) to changes in signals at said output (85) and to changes in signals (R, RD) output by said second delay, gain and phase adjuster (DGPA2);

said fourth splitter (S6) connected to receive the output (75) of said second combiner (C2); and, said fourth splitter (S6) providing said amplified replica at its output (80).

2. A feed forward amplifier circuit as defined in claim 1, wherein said first and second delay, gain and phase adjusters (DGPA1, DGPA2) each comprise:

a fifth splitter (S7) for splitting a selected input signal (I) between main and delayed signal branches;

said main signal branch comprising a sixth splitter (S8) for splitting said main branch signal to provide said output (R) and an input (155) of a first complex gain adjuster (CGA3);

said delayed signal branch comprising a third delay line (DL3) for delaying said input signal (I) connected in series between said fifth splitter (S7) and a seventh splitter (S9) for splitting said delayed signal to provide said output (RD) and an input (140) of a second complex gain adjuster (CGA4); and, a third combiner (C3) having first and second inputs (145, 160) connected to receive signals output by said first and second complex gain adjusters (CGA3, CGA4) respectively.

3. A feed forward amplifier circuit as defined in claim 2, further comprising:

means (S10, C5) for subtractively coupling said delayed signal into said main signal branch for input to said sixth splitter (S8); and, means (S11, C4) for additively coupling said input signal (I) into said delayed signal branch for input to said seventh splitter (S9).

4. A feed forward amplifier circuit as defined in claim 1, wherein said first and second controllers (CT3, CT4) each comprise:

first and second bandpass correlators (BPC1, BPC2) for receiving said signals at said respective outputs (100, 85) and said (R) and (RD) output signals, and for outputting signals (GA, GB, GAD, GBD) to said first and second delay, gain and phase adjusters (DGPA1, DGPA2) respectively;

wherein:

while outputting said signals (GA, GB) said first bandpass correlator (BPC1) drives to zero correlation between said signals at said respective outputs (100, 85) and said (R) output signal; and, while outputting said signals (GAD, GBD) said second bandpass correlator (BPC2) drives to zero correlation between said signals at said respective outputs (100, 85) and said (RD) output signal.

5. A feed forward amplifier circuit as defined in claim 1, 2 or 3, wherein said first and second controllers (CT3, CT4) each comprise:

first and second bandpass correlators (BPC3, BPC4) for receiving said signals at said respective outputs (100, 85) and said (R) and (RD) output signals, and for outputting signals (GA, GB, GAD, GBD) to said first and second delay, gain and phase adjusters (DGPA1, DGPA2) respectively; and, means (LO1; M1, BPF1; M2, BPF2; M3, BPF3) for selecting desired frequency components of said respective received signals and for reducing said respective received signals to a common intermediate frequency prior to delivery of said received signals to said respective first and second bandpass correlators (BPC3, BPC4).

6. A feed forward amplifier circuit as defined in claim 1, 2 or 3, wherein said first and second controllers (CT3, CT4) each comprise:

a digital signal processor (DSP1) for bandpass correlating said signals at said respective outputs (100, 85) with said (R) and (RD) output signals, and for outputting signals (GA, GB, GAD, GBD) to said first and second delay, gain and phase adjusters (DGPA1, DGPA2) respectively;

means (LO1; M1, BPF1; M2, BPF2; M3, BPF3) for selecting desired frequency components of said respective received signals and for reducing said respective received signals to a common intermediate frequency prior to delivery of said received signals to said digital signal processor (DSP1); and, means (LO2; M4, BPF4; M5, BPF5; M6, BPF6) for further reducing said respective received signals to a low frequency prior to delivery of said received signals to said digital signal processor (DSP1).

7. A feed forward amplifier circuit for amplifying an input signal to produce an amplified replica thereof, said circuit comprising:

a first splitter (S1) for splitting said input signal into first and second signal cancellation branches;

said first signal cancellation branch comprising an amplifier (A1) for producing an amplified output signal (20), a first adjuster (DGPA1) for adjusting complex gain attributes of signals input to said amplifier, said first adjuster connected in series between a first output (10) of said first splitter (S1) and said amplifier (A1), and a second splitter (S2) connected in series with said amplifier output (20) for splitting said amplified output signal (20) into first and second distortion cancellation branches;

said second signal cancellation branch comprising a first delay line (DL1) connected in series between a second output (30) of said first splitter (S1) and a first input (40) of a first combiner (C1);

said second splitter (S2) having a first output (25) coupled to a second input of said first combiner (C1);

said first distortion cancellation branch comprising a second delay line (DL2) connected in series between a second output (65) of said second splitter (S2) and a first input (70) of a second combiner (C2);

said second distortion cancellation branch comprising a third splitter (S4) connected in series between said first combiner (C1) and a second adjuster (DGPA2) for adjusting complex gain attributes of signals input to an auxiliary amplifier (A2), said auxiliary amplifier (A2) connected in series between said second adjuster (DGPA2) and a second input (60) of said second combiner (C2);

a first controller (CT3) connected between an output (100) of said third splitter (S4) and said first adjuster (DGPA1), said first controller comprising a power detector (PD1) for converting signals at said output (100) to a representation of power in said signals at said output (100) and for inputting said representation to a digital signal processor (DSP2) for adjusting output signals (GA, GB, GAD, GBD) of said first controller (CT3) to minimize said representation; and, a second controller (CT4) connected between an output (85) of a fourth splitter (S6) and said second adjuster (DGPA2), said second controller (CT4) comprising a second power detector for converting signals at said output (85) to a second representation of power in said signals at said output (85) and for inputting said second representation to a second digital signal processor for adjusting output signals (GA, GB, GAD, GBD) of said second controller (CT4) to minimize said second representation;

said fourth splitter (S6) connected to receive the output (75) of said second combiner (C2); and, said fourth splitter (S6) providing said amplified replica at its output (80).

8. A feed forward amplifier circuit as defined in claim 7, wherein said digital signal processor (DSP2) maintains internal variables (GASUM, GBSUM, GADIFF, GBDIFF) from which said output signals (GA, GB, GAD, GBD) are determined, and said adjustment comprises:

(a) applying small initial perturbations to said internal variables (GASUM, GBSUM, GADIFF, GBDIFF) and corresponding perturbations to said output signals (GA, GB, GAD, GBD) to yield a resultant value of said representation;

(b) measuring said resultant value of said representation;

(c) deriving components (GRADGASUM, GRADGBSUM, GRADGADIFF, GRADGBDIFF) of an estimated gradient of said representation with respect to said internal variables (GASUM, GBSUM, GADIFF, GBDIFF);

(d) deriving adjusted values of said internal variables (GASUM, GBSUM, GADIFF, GBDIFF) by subtracting a portion of said components (GRADGASUM, GRADGBSUM, GRADGADIFF, GRADGBDIFF) from said internal variables (GASUM, GBSUM, GADIFF, GBDIFF); and, (e) applying said output signals (GA, GB, GAD, GBD) determined from said adjusted values.

9. A feed forward amplifier circuit as defined in claim 7 or 8, wherein said first and second controllers (CT3, CT4) respectively further comprise:

means (LO3; M7, BPF7) for sequentially selectively reducing desired frequency components of said respective received signals to a range of common intermediate frequencies prior to delivery of said received signals to said digital signal processor (DSP2) to yield a series of said representations corresponding to each of said intermediate frequencies;

wherein said first and second controllers (CT3, CT4) respectively sum said representations to yield a resultant value of said representation.

10. A feed forward amplifier circuit for amplifying an input signal to produce an amplified replica thereof, said circuit comprising:

a first splitter (S1) for splitting said input signal into first and second signal cancellation branches;

said first signal cancellation branch comprising an amplifier (A1) for producing an amplified output signal (20), a first adjuster (DGPA1) for adjusting complex gain attributes of signals input to said amplifier, said first adjuster connected in series between a first output (10) of said first splitter (S1) and said amplifier (A1), and a second splitter (S2) connected in series with said amplifier output (20) for splitting said amplified output signal (20) into first and second distortion cancellation branches;

said second signal cancellation branch comprising a first delay line (DL1) connected in series between a second output (30) of said first splitter (S1) and a first input (40) of a first combiner (C1);

said second splitter (S2) having a first output (25) coupled to a second input of said first combiner (C1);

said first distortion cancellation branch comprising a second delay line (DL2) connected in series between a second output (65) of said second splitter (S2) and a first input (70) of a second combiner (C2);

said second distortion cancellation branch comprising a third splitter (S4) connected in series between said first combiner (C1) and a second adjuster (DGPA2) for adjusting complex gain attributes of signals input to an auxiliary amplifier (A2), said auxiliary amplifier (A2) connected in series between said second adjuster (DGPA2) and a second input (60) of said second combiner (C2);

a first controller (CT3) connected between an output (100) of said third splitter (S4) and said first adjuster (DGPA1), said first controller (CT3) for receiving signals at said output (100) and signals (R) output by said first adjuster (DGPA1), said first controller comprising a first bandpass correlator (BPC3) for outputting signals (GA, GB) to said first adjuster (DGPA1) and means (LO1; M1, BPF1; M2, BPF2) for selecting desired frequency components of said received signal (100) and for reducing said received signal to an intermediate frequency prior to delivery of said received signal to said first bandpass correlator (BPC3); and, a second controller (CT4) connected between an output (85) of a fourth splitter (S6) and said second adjuster (DGPA2), said second controller (CT4) for receiving signals at said output (85) and signals (R) output by said second adjuster (DGPA2), said second controller comprising a second bandpass correlator (BPC4) for outputting signals (GA, GB) to said second adjuster (DGPA2) and means (LO1; M1, BPF1; M2, BPF2) for selecting desired frequency components of said received signal (85) and for reducing said received signal to an intermediate frequency prior to delivery of said received signal to said second bandpass correlator (BPC4);

said fourth splitter (S6) connected to receive the output (75) of said second combiner (C2); and, said fourth splitter (S6) providing said amplified replica at its output (80).

11. A feed forward amplifier circuit as defined in claim 10, wherein said first and second controllers (CT3, CT4) each comprise:

a digital signal processor (DSP1) for bandpass correlating said signals at said respective outputs (100, 85) with said (R) output signal, and for outputting said signals (GA, GB) to said first and second adjusters (DGPA1, DGPA2) respectively;

means (LO1; M1, BPF1; M2, BPF2) for selecting desired frequency components of said respective received signals and for reducing said respective received signals to a common intermediate frequency prior to delivery of said received signals to said digital signal processor (DSP1); and, means (LO2; M4, BPF4; M5, BPF5) for further reducing said respective received signals to a low frequency prior to delivery of said received signals to said digital signal processor (DSP1).

12. A feed forward amplifier circuit for amplifying an input signal to produce an amplified replica thereof, said circuit comprising:

a first splitter (S1) for splitting said input signal into first and second signal cancellation branches;

said first signal cancellation branch comprising an amplifier (A1) for producing an amplified output signal (20), a first adjuster (DGPA1) for adjusting complex gain attributes of signals input to said amplifier, said first adjuster connected in series between a first output (10) of said first splitter (S1) and said amplifier (A1), and a second splitter (S2) connected in series with said amplifier output (20) for splitting said amplified output signal (20) into first and second distortion cancellation branches;

said second signal cancellation branch comprising a first delay line (DL1) connected in series between a second output (30) of said first splitter (S1) and a first input (40) of a first combiner (C1);

said second splitter (S2) having a first output (25) coupled to a second input of said first combiner (C1);

said first distortion cancellation branch comprising a second delay line (DL2) connected in series between a second output (65) of said second splitter (S2) and a first input (70) of a second combiner (C2);

said second distortion cancellation branch comprising a third splitter (S4) connected in series between said first combiner (C1) and a second adjuster (DGPA2) for adjusting complex gain attributes of signals input to an auxiliary amplifier (A2), said auxiliary amplifier (A2) connected in series between said second adjuster (DGPA2) and a second input (60) of said second combiner (C2);

a first controller (CT3) connected between an output (100) of said third splitter (S4) and said first adjuster (DGPA1), said first controller comprising a power detector (PD1) for converting signals at said output (100) to a representation of power in said signals at said output (100) and for inputting said representation to a digital signal processor (DSP2) for continuously estimating the power gradient of said representation and for outputting signals (GA, GB) to said first adjuster (DGPA1) while adjusting said output signals (GA, GB) to minimize said representation; and, a second controller (CT4) connected between an output (85) of a fourth splitter (S6) and said second adjuster (DGPA2), said second controller (CT4) comprising a second power detector for converting signals at said output (85) to a second representation of power in said signals at said output (85) and for inputting said second representation to a second digital signal processor for continuously estimating the power gradient of said second representation and for outputting signals (GA, GB) to said second adjuster (DGPA2) while adjusting said output signals (GA, GB) to minimize said second representation;

said fourth splitter (S6) connected to receive the output (75) of said second combiner (C2); and, said fourth splitter (S6) providing said amplified replica at its output (80).

13. A feed forward amplifier circuit as defined in claim 12, further comprising, in each of said first and second controllers (CT3, CT4), means (LO3; M7, BPF7) for sequentially selectively reducing desired frequency components of said respective signals (100, 85) to a range of common intermediate frequencies prior to delivery of said signals (100, 85) to said respective power detectors to yield a series of said representations corresponding to each of said intermediate frequencies; and wherein said first and second controllers (CT3, CT4) respectively sum said representations to yield said resultant value of said representation.

14. A method of linearizing an amplifier by deriving a distortion signal representative of IM distortion in signals output by said amplifier and applying said distortion signal to cancel distortion in said amplifier output signal to yield a substantially distortion-free replica of said amplifier output signal, wherein:

(a) said distortion signal derivation step further comprises:
(i) approximating said distortion signal by subtractively combining said amplifier output signal with an input signal to be amplified;
(ii) reducing said approximated distortion signal to an intermediate frequency;
(iii) selecting desired frequency components of said approximated intermediate frequency distortion signal;

(iv) bandpass correlating said desired frequency components with said input signal;
(v) applying said bandpass correlation to adaptively adjust complex gain attributes of signals input to said amplifier;
(vi) subtractively combining said complex gain adjusted amplifier output signal with said input signal to yield said distortion signal;

(b) said distortion cancellation step further comprises:
(i) approximating said distortion-free replica by subtractively combining said amplifier output signal with said distortion signal;
(ii) reducing said approximated replica to an intermediate frequency;
(iii) selecting desired frequency components of said approximated intermediate frequency replica;
(iv) bandpass correlating said desired frequency components of said approximated replica with said distortion signal;
(v) applying said bandpass correlation of said approximated replica and distortion signal to adaptively adjust complex gain attributes of said distortion signal; and,
(vi) subtractively combining said amplifier output signal with said complex gain adjusted distortion signal to yield said replica.

15. A method of linearizing an amplifier by deriving a distortion signal representative of IM distortion in signals output by said amplifier and applying said distortion signal to cancel distortion in said amplifier output signal to yield a substantially distortion-free replica of said amplifier output signal, wherein:

(a) said distortion signal derivation step further comprises:
(i) approximating said distortion signal by subtractively combining said amplifier output signal with an input signal to be amplified;
(ii) deriving a signal representative of power in said approximated distortion signal;
(iii) perturbing complex gain attributes of signals input to said amplifier;
(iv) deriving a corresponding perturbed signal representative of power in said approximated distortion signal;
(v) iteratively repeating steps (a) (i)–(a) (iv) while, for each iteration, deriving further signals representative of power in said approximated distortion signal;
(vi) estimating the power gradient of said further signals;
(vii) adaptively adjusting, in a direction opposite to said power gradient estimate, said complex gain attributes of signals input to said amplifier;
(viii) subtractively combining said complex gain adaptively adjusted amplifier output signal with said input signal to yield said distortion signal;

(b) said distortion cancellation step further comprises:
(i) approximating said distortion-free replica by subtractively combining said amplifier output signal with said distortion signal;
(ii) deriving a signal representative of power in said approximated distortion-free replica;
(iii) perturbing complex gain attributes of said distortion signals;
(iv) deriving a corresponding perturbed signal representative of power in said approximated distortion-free replica;
(v) iteratively repeating steps (b)(i)–(b)(iv) while, for each iteration, deriving further signals representative of power in said distortion-free replica;
(vi) estimating the power gradient of said further signals derived in step (b)(v);
(vii) adaptively adjusting, in a direction opposite to said step (b)(vi) estimate, said complex gain attributes of said distortion signal; and,
(viii) subtractively combining said amplifier output signal with said step complex gain adaptively adjusted distortion signal to yield said replica.

* * * * *